United States Patent
Liu et al.

(10) Patent No.: US 11,476,242 B2
(45) Date of Patent: Oct. 18, 2022

(54) CASCODE POWER ELECTRONIC DEVICE PACKAGING METHOD AND PACKAGING STRUCTURE THEREOF

(71) Applicant: Ultraband Technologies Inc., Taipei (TW)

(72) Inventors: Tai-Hui Liu, Taipei (TW); Chung-Hsi Liu, Taipei (TW)

(73) Assignee: ULTRABAND TECHNOLOGIES INC., Taipei (TW)

( * ) Notice: Subject to any disclaimer, the term of this patent is extended or adjusted under 35 U.S.C. 154(b) by 6 days.

(21) Appl. No.: 17/229,880

(22) Filed: Apr. 14, 2021

(65) Prior Publication Data

US 2021/0358899 A1 Nov. 18, 2021

(30) Foreign Application Priority Data

May 14, 2020 (TW) .................................. 109115952

(51) Int. Cl.
*H01L 23/06* (2006.01)
*H01L 23/34* (2006.01)
(Continued)

(52) U.S. Cl.
CPC .......... *H01L 25/18* (2013.01); *H01L 21/4807* (2013.01); *H01L 21/561* (2013.01); *H01L 21/565* (2013.01); *H01L 21/568* (2013.01); *H01L 21/78* (2013.01); *H01L 23/3121* (2013.01); *H01L 23/367* (2013.01); *H01L 24/37* (2013.01); *H01L 24/40* (2013.01); *H01L 24/84* (2013.01); *H01L 24/96* (2013.01);
(Continued)

(58) Field of Classification Search
CPC ....... H01L 25/18; H01L 25/50; H01L 25/072; H01L 25/0655; H01L 23/3121; H01L 23/367; H01L 24/37; H01L 24/40; H01L 24/84; H01L 24/96; H01L 21/4807; H01L 21/561; H01L 21/565; H01L 21/568; H01L 21/78
See application file for complete search history.

(56) References Cited

U.S. PATENT DOCUMENTS

| 8,617,927 B1* | 12/2013 | Margomenos | H01L 23/42 |
| | | | 257/713 |
| 2019/0043843 A1* | 2/2019 | Liu | H01L 25/0753 |

(Continued)

*Primary Examiner* — Alonzo Chambliss
(74) *Attorney, Agent, or Firm* — Leong C. Lei

(57) ABSTRACT

The present invention provides a packaging method and a packaging structure for a cascode power electronic device, in which a hetero-multiple chip scale package is used to replace the traditional die bonding and wire bonding packaging method. The cascode power electronic device can reduce the inductance resistance and thermal resistance of the connecting wires and reduce the size of the package; and increase the switching frequency of power density. The chip scale package of the present invention uses more than one gallium nitride semiconductor die, more than one diode, and more than one metal oxide semiconductor transistor. The package structure can use TO-220, quad flat package or other shapes and sizes; the encapsulation process of the traditional epoxy molding compounds can be used in low-power applications; and the encapsulation process of ceramic material can be used in high-power applications.

10 Claims, 20 Drawing Sheets

(51) Int. Cl.
*H01L 21/00* (2006.01)
*H05K 7/00* (2006.01)
*H05K 1/16* (2006.01)
*H01L 25/18* (2006.01)
*H01L 23/00* (2006.01)
*H01L 23/31* (2006.01)
*H01L 23/367* (2006.01)
*H01L 21/48* (2006.01)
*H01L 21/56* (2006.01)
*H01L 21/78* (2006.01)
*H01L 25/00* (2006.01)
*H01L 25/07* (2006.01)
*H01L 25/075* (2006.01)
*H01L 25/065* (2006.01)

(52) U.S. Cl.
CPC ........ *H01L 25/0655* (2013.01); *H01L 25/072* (2013.01); *H01L 25/0753* (2013.01); *H01L 25/50* (2013.01); H01L 2224/37147 (2013.01); H01L 2224/40137 (2013.01); H01L 2224/84005 (2013.01); H01L 2224/95001 (2013.01); H01L 2924/1033 (2013.01); H01L 2924/10253 (2013.01); H01L 2924/12035 (2013.01); H01L 2924/13064 (2013.01); H01L 2924/13091 (2013.01)

(56) References Cited

U.S. PATENT DOCUMENTS

2020/0006235 A1* 1/2020 Aleksov ................. H01L 24/17
2020/0251415 A1* 8/2020 Kim ...................... H01L 23/552

* cited by examiner

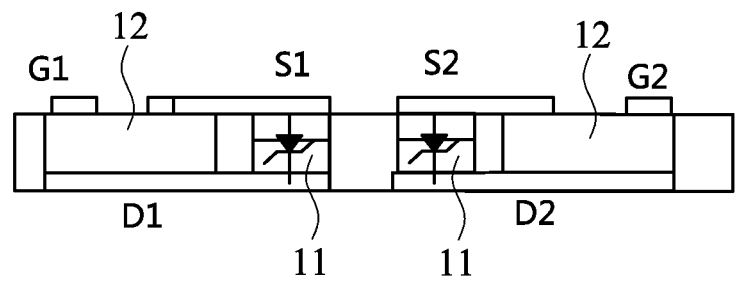
FIG. 11a
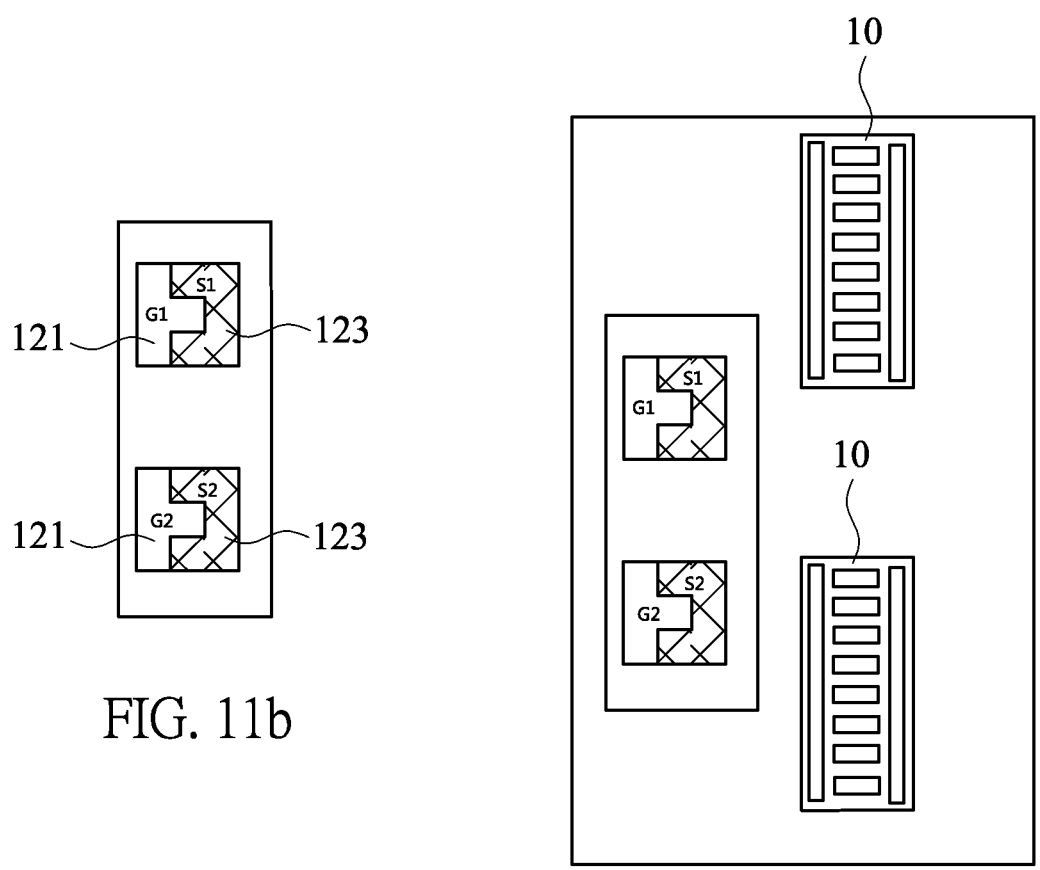
FIG. 11b
FIG. 11c

CASCODE POWER ELECTRONIC DEVICE PACKAGING METHOD AND PACKAGING STRUCTURE THEREOF

(a) TECHNICAL FIELD OF THE INVENTION

The present invention relates to a packaging method and a packaging structure for a cascode power electronic device, and more particularly to a packaging method and a packaging structure for a cascode power electronic device by hetero-multiple chip scale package.

(b) DESCRIPTION OF THE PRIOR ART

On Semiconductor Corporation is optimistic that gallium nitride (GaN) can provide power applications and provide performance advantages over silicon-based components. Therefore, On Semiconductor Corporation has developed and promoted GaN-based products and power system solutions, and launched a 600V GaN cascade structure transistors NTP8G202N and NTP8G206N for various high voltage applications in the fields of industry, such as computers, communications, LED lighting and network. The on-state resistances of the NTP8G202N and NTP8G206N components are respectively 290 mΩ and 150 mΩ, the gate charges are both 6.2 nC, the output capacitances are respectively 36 pF and 56 pF, and the reverse recovery charges are respectively 0.029 μC and 0.054 μC. It is easy to integrate according to the customer's existing board-making capabilities by using the optimized TO-220 package.

Based on the same on-state resistance level, a first-generation 600V GaN-on-Si components have provided 4 times higher gate charge, better output charge, similar output capacitance, and 20 times higher quality than high-voltage silicon MOSFETs. The above GaN-on-Si components will continue to be improved, and the advantages of GaN will become more and more obvious in the future.

SUMMARY OF THE INVENTION

The main purpose of the present invention is to provide a packaging method and a packaging structure for a cascode power electronic device. The cascode power electronic device can reduce the inductance, resistance and thermal resistance of the connecting wires and the size of the package, and the power density and switching frequency can be improved.

To achieve the above objective, the present invention provides a packaging method for a cascode power electronic device comprising:

providing a substrate and disposing a pressure sensitive adhesive layer on the substrate;

disposing more than one gallium nitride semiconductor die, more than one diode and more than one metal oxide semiconductor transistor on the pressure sensitive adhesive layer;

coating a first photo-developing layer on the pressure sensitive adhesive layer, the first photo-developing layer covering the gallium nitride semiconductor die, the diode and the metal oxide semiconductor transistor;

exposing and developing a first surface of the first photo-developing layer on the gallium nitride semiconductor die, the diode, and metal oxide semiconductor transistor, and plating copper on the exposed and developed area to form a copper plating layer;

disposing a first plastic layer on the first photo-developing layer, the first plastic layer covering the unexposed development area on the first photo-developing layer and the copper plating layer, and providing a heat sink on the first plastic layer;

peeling the substrate and the pressure sensitive adhesive layer;

coating a second photo-developing layer on a second surface of the first photo-developing layer, and the second photo-developing layer covering the gallium nitride semiconductor die, the diode, and metal oxide semiconductor transistor;

exposing and developing the second photo-developing layer to expose a gate and a drain of the gallium nitride semiconductor die, a drain and a source of the metal oxide semiconductor transistor and the diode;

forming a redistribution layer on the gate and the drain of the gallium nitride semiconductor die, the drain and the source of the metal oxide semiconductor transistor and the diode;

plating a protective layer on the redistribution layer;

adhering a blue tape on a ceramic heat sink, and dicing the gallium nitride semiconductor die, the diode, the metal oxide semiconductor transistor, the first plastic layer and the ceramic heat sink to form a plurality of package modules; connecting the package modules to each other only through the blue tape; stretching the blue tape to increase gaps between the package modules; removing the blue tape to obtain the plurality of package modules; and cascading with the plurality of package modules to form a power electronic device.

In some embodiments, the gallium nitride semiconductor die is a laterally conductive vertical structure or a horizontal structure; the gallium nitride semiconductor die has a front surface and a back surface opposite to the front surface; and the source of gallium nitride semiconductor die is connected to the back surface by a through hole.

In some embodiments, the metal oxide semiconductor transistor and the diode are connected together by a metal oxide semiconductor process.

In some embodiments, after the copper plating layer is formed and before the substrate and the pressure sensitive adhesive layer are peeled off, the first photo-developing layer is separated into a plurality of interval grooves, a second plastic layer is disposed on the interval grooves, and a baffle is installed on the second plastic layer.

The present invention also provides a package structure for a cascode power electronic device made by the aforementioned method, and the package structure comprises package modules cascaded with each other in an array. Further, every package module comprises a gallium nitride semiconductor die, a diode, a metal oxide semiconductor transistor, a first photo-developing layer, a copper plating layer, a first plastic layer, a heat sink, a second photo-developing layer, a redistribution layer and a protective layer; wherein the gallium nitride semiconductor die is a laterally conductive vertical structure or a horizontal structure; the diode is connected to the metal oxide semiconductor transistor; and there is a set distance between the gallium nitride semiconductor die and the diode connecting the metal oxide semiconductor transistor. Further, the first photo-developing layer covers the gallium nitride semiconductor die, the diode and the metal oxide semiconductor transistor; a first opening is revealed through exposure and development; and the copper plating layer is disposed on the first opening to connect the gallium nitride semiconductor die with the diode and the metal oxide semiconductor transistor. The first plastic layer is disposed on the copper plating layer and the first surface of the first photo-developing layer. In addition, the heat sink is installed on the first plastic layer; and the second photo-developing layer covers a second surface of the first photo-developing layer. Furthermore, a second opening is revealed through exposure and development, the redistribution layer is disposed on second opening, and the protective layer is arranged around the redistribution layer.

In some embodiments, the heat sink is a ceramic heat sink or a metal plate.

In some embodiments, the protective layer is a nickel metal layer, a copper metal layer or a nickel-copper alloy layer.

The present invention further provides a packaging method for a cascode power electronic device comprising:

providing a substrate and disposing a pressure sensitive adhesive layer on the substrate;

disposing more than one gallium nitride semiconductor die, more than one diode, more than one metal oxide semiconductor transistor and more than one metal block on the pressure sensitive adhesive layer;

coating a first photo-developing layer on the pressure sensitive adhesive layer, the first photo-developing layer covering the gallium nitride semiconductor die, the diode, the metal oxide semiconductor transistor and the metal block;

exposing and developing a first surface of the first photo-developing layer on the gallium nitride semiconductor die, the metal oxide semiconductor transistor, the diode and the metal block, and plating copper on the exposed and developed area to form a copper plating layer;

disposing a first plastic layer on the first photo-developing layer, the first plastic layer covering the unexposed development area on the first plastic layer and the copper plating layer, and providing a heat sink on the first plastic layer;

peeling the substrate and the pressure sensitive adhesive layer;

coating a second photo-developing layer on a second surface of the first photo-developing layer, and the second photo-developing layer covering the gallium nitride semiconductor die, the diode, metal oxide semiconductor transistor and the metal block;

exposing and developing the second photo-developing layer to expose a drain of the gallium nitride semiconductor die, a gate and a source of the metal oxide semiconductor transistor, the diode and the metal block;

plating metal on the exposed area to form a metal layer;

plating a protective layer on the metal layer; and adhering a blue tape on a ceramic heat sink, and dicing the gallium nitride semiconductor die, the diode, the metal oxide semiconductor transistor, the metal block, the first plastic layer and the ceramic heat sink to form a plurality of package modules; connecting the package modules to each other only through the blue tape; stretching the blue tape to increase gaps among the package modules; removing the blue tape to obtain the plurality of package modules; and cascading with the plurality of package modules to form a power electronic device.

In some embodiments, the gallium nitride semiconductor die is a laterally conductive vertical structure or a horizontal structure; the gallium nitride semiconductor die has a front surface and a back surface opposite to the front surface; and the drain of gallium nitride semiconductor die is connected to the back surface by a through hole.

In some embodiments, the metal oxide semiconductor transistor and the diode are connected together by a metal oxide semiconductor process.

The present invention further provides a package structure for a cascode power electronic device made by the aforementioned method, and the package structure comprises package modules cascaded with each other in an array. Further, every package module comprises a gallium nitride semiconductor die, a diode, a metal oxide semiconductor transistor, a metal block, a first photo-developing layer, a copper plating layer, a first plastic layer, a heat sink, a second photo-developing layer, a redistribution layer and a protective layer; wherein the gallium nitride semiconductor die is a laterally conductive vertical structure or a horizontal structure; the diode is connected to the metal oxide semiconductor transistor; and there is a set distance between the gallium nitride semiconductor die and the diode connecting the metal oxide semiconductor transistor; and there is another set distance between the gallium nitride semiconductor die with the metal block. Further, the first photo-developing layer covers the gallium nitride semiconductor die, the diode, the metal oxide semiconductor transistor and the metal block; a first opening is revealed through exposure and development; and the copper plating layer is disposed on the first opening to connect the gallium nitride semiconductor die with the metal block and connect the gallium nitride semiconductor die with the diode and the metal oxide semiconductor transistor. The first plastic layer is disposed on the copper plating layer and the first surface of the first photo-developing layer. In addition, the heat sink is installed on the first plastic layer; and the second photo-developing layer covers a second surface of the first photo-developing layer. Furthermore, the second photo-developing layer is exposed and developed to reveal a second opening, the redistribution layer is disposed on the second opening, and the protective layer is arranged around the redistribution layer.

BRIEF DESCRIPTION OF THE DRAWINGS

The above and other objectives, features and other advantages of the present invention will be more clearly understood from the following detailed description taken in conjunction with the accompanying drawings, in which:

FIG. 11a is a schematic side view of the metal oxide semiconductor transistor and the diode according to Embodiment 5 of the present invention;

FIG. 11b is a schematic top view of the metal oxide semiconductor transistor and the diode according to the Embodiment 5 of the present invention;

FIG. 11c is a schematic top view of the gallium nitride semiconductor die, the metal oxide semiconductor transistor and the diode according to Embodiment 5 of the present invention;

DETAILED DESCRIPTION OF THE PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The following detailed description of the present application is taken in conjunction with the accompanying drawings, in which:

Please refer to FIG. 1a to FIG. 1j, FIG. 1a to FIG. 1j are structural diagrams of packaging steps of a power electronic according to Embodiment 1 of the present invention.

Figure 1A:
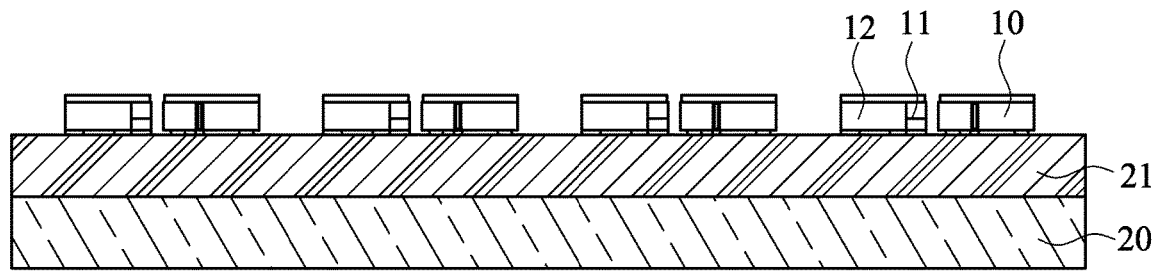
FIG. 1a to FIG. 1j are structural diagrams of packaging steps of a power electronic according to Embodiment 1 of the present invention.
Figure 1B:
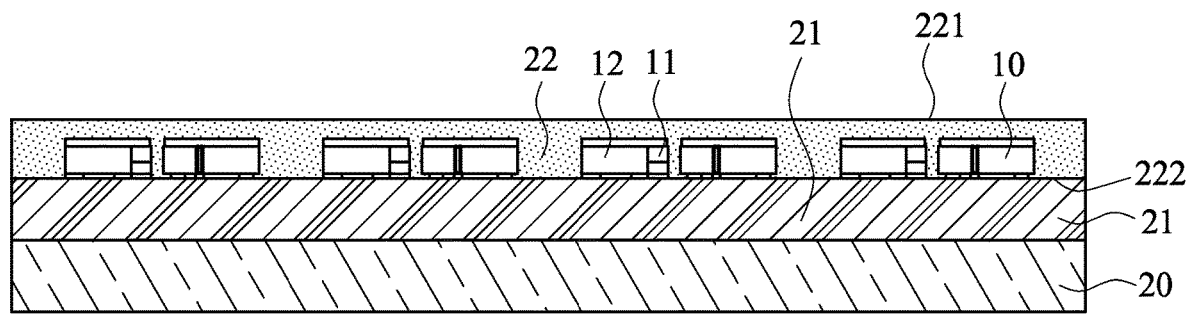
Figure 1C:
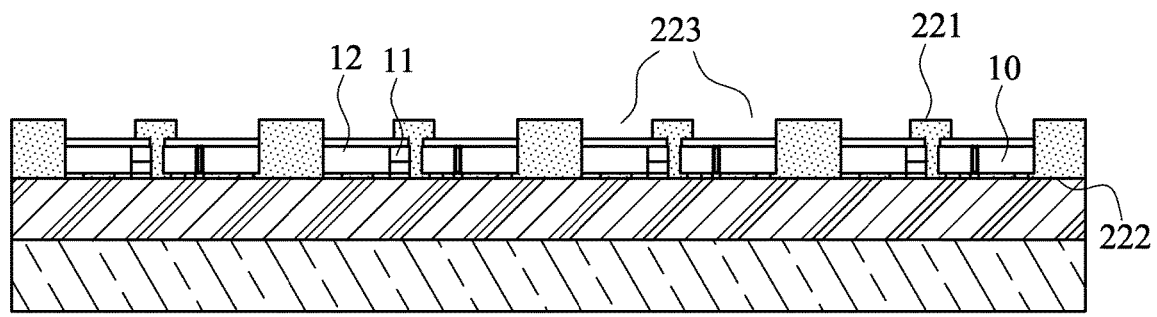
Figure 1D:
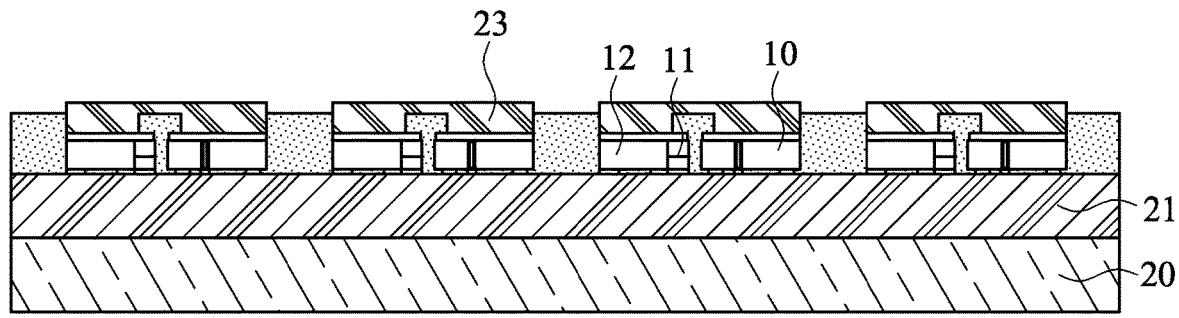
Figure 1E:
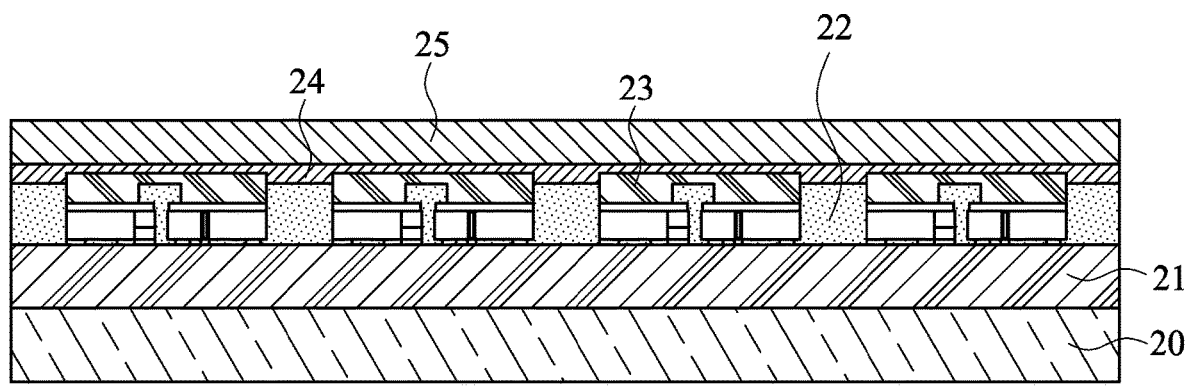
Figure 1F:
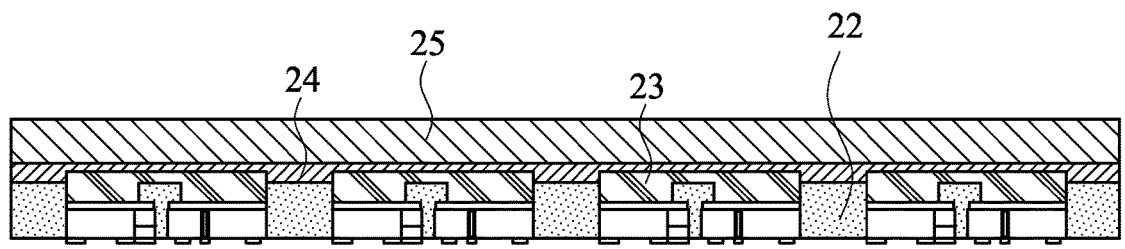
Figure 1G:
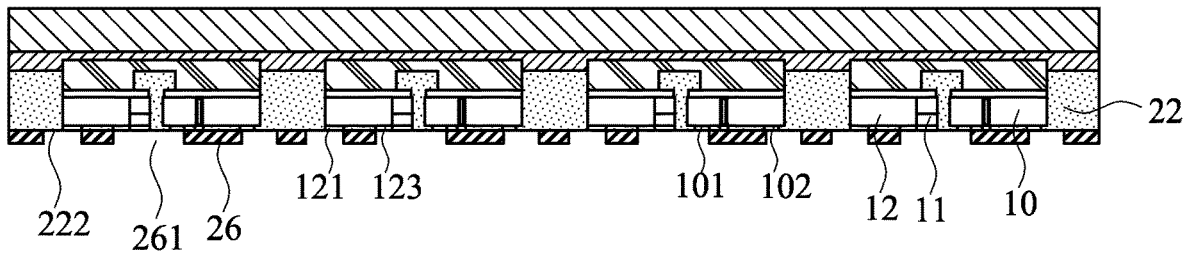
Figure 1H:
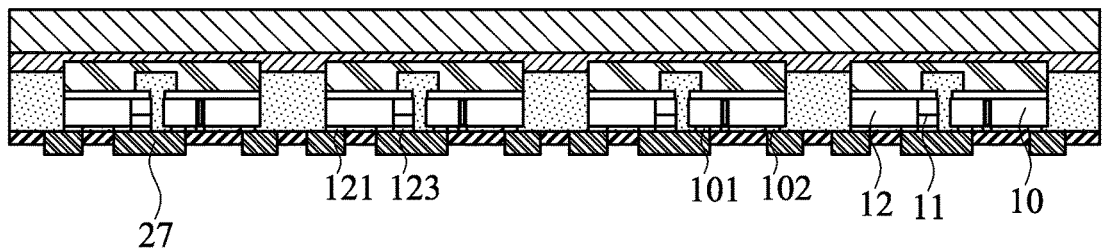
Figure 1I:
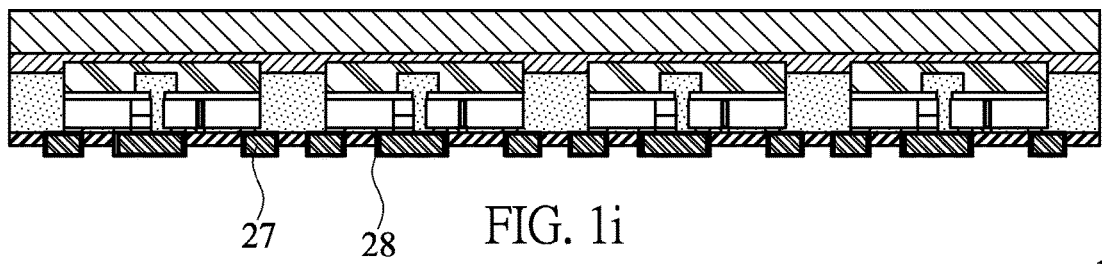
Figure 1J:
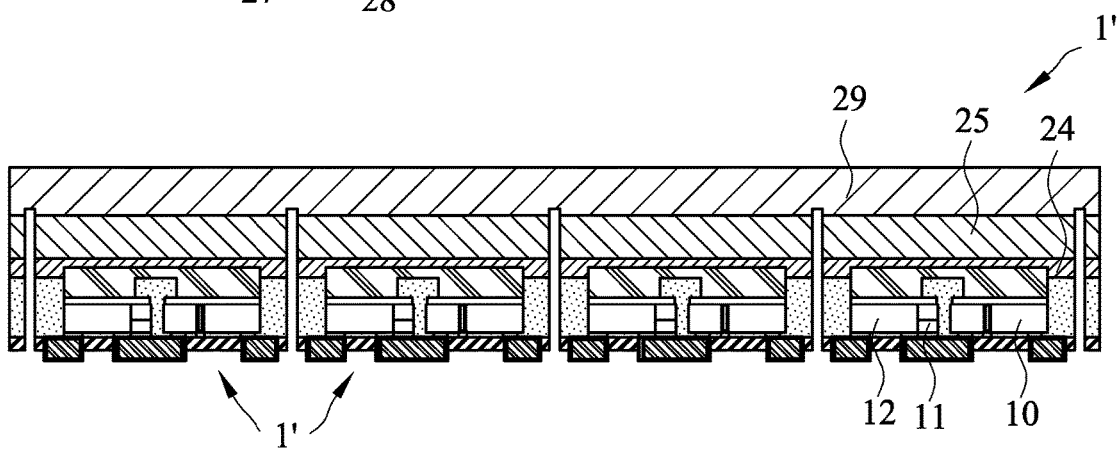

As shown in FIG. 1a to FIG. 1j, the present invention provides a packaging method for a cascode power electronic device comprising:

providing a substrate 20 and disposing a pressure sensitive adhesive layer 21 on the substrate 20;

disposing more than one gallium nitride semiconductor die 10 with a laterally conductive vertical structure, more than one diode 11 and more than one metal oxide semiconductor transistor 12 on the pressure sensitive adhesive layer 21, as shown in FIG. 1a;

coating a first photo-developing layer 22 on the pressure sensitive adhesive layer 21, the first photo-developing layer 22 covering the gallium nitride semiconductor die 10, the diode 11 and the metal oxide semiconductor transistor 12, as shown in FIG. 1b;

exposing and developing a first surface 221 of the first photo-developing layer 22 on the gallium nitride semiconductor die 10, the diode 11, and metal oxide semiconductor transistor 12, as shown in FIG. 1c; and plating copper on the exposed and developed area to form a copper plating layer 23, as shown in FIG. 1d;

disposing a first plastic layer 24 on the first photo-developing layer 22, the first plastic layer 24 covering the unexposed development area on the first photo-developing layer 22 and the copper plating layer 23, and providing a heat sink 25 on the first plastic layer 24; wherein the heat sink 25 is a ceramic heat sink or a metal heat sink, as shown in FIG. 1e;

peeling the substrate 20 and the pressure sensitive adhesive layer 21, as shown in FIG. 1f;

coating a second photo-developing layer 26 on a second surface 222 of the first photo-developing layer 22, and the second photo-developing layer 26 covering the gallium nitride semiconductor die 10, the diode 11, and metal oxide semiconductor transistor 12;

exposing and developing the second photo-developing layer 26 to reveal a gate 101 and a drain 102 of the gallium nitride semiconductor die 10, a drain 121 and a source 123 of the metal oxide semiconductor transistor 12 and the diode 11, as shown in FIG. 1g;

forming a redistribution layer 27 on the gate 101 and the drain 102 of the gallium nitride semiconductor die 10, the drain 121 and the source 123 of the metal oxide semiconductor transistor 12 and the diode 11, as shown in FIG. 1h;

plating a protective layer 28 on the redistribution layer 27; wherein the protective layer 28 is a nickel metal layer, a copper metal layer or a nickel-copper alloy layer, as shown in FIG. 1i;

adhering a blue tape 29 on a ceramic heat sink 25, and dicing the gallium nitride semiconductor die 10, the diode 11, the metal oxide semiconductor transistor 12, the first plastic layer 24 and the ceramic heat sink 25 to form a plurality of package modules 1'; connecting the package modules 1' to each other only through the blue tape 29; stretching the blue tape 29 to increase gaps among the package modules 1'; removing the blue tape 29 to obtain the plurality of package modules 1'; and cascading with the plurality of package modules 1' to form a power electronic device, as shown in FIG. 1j.

Figure 2A:
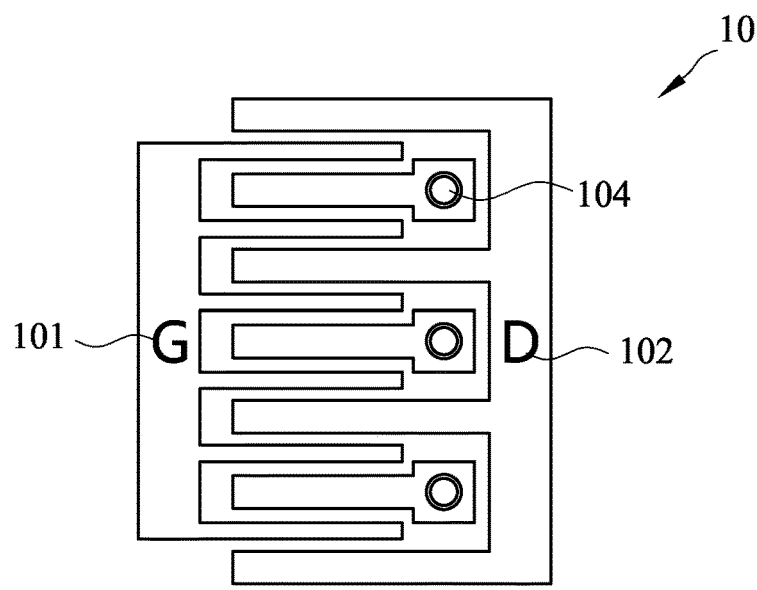
FIG. 2a is a schematic top view of a gallium nitride semiconductor die of Embodiment 1 of the present invention.
Figure 2B:
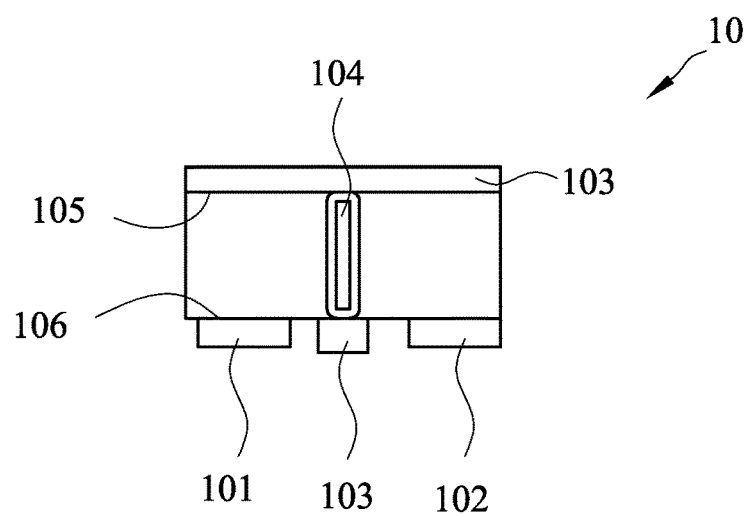
FIG. 2b is a schematic side view of the gallium nitride semiconductor die of Embodiment 1 of the present invention.
Figure 3A:
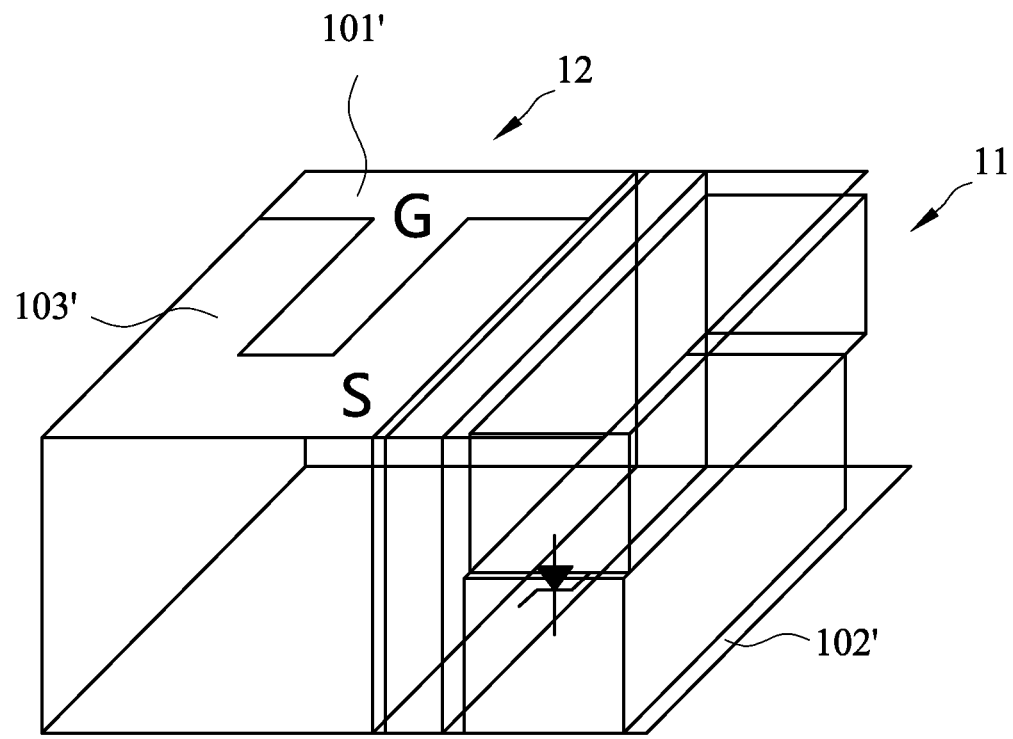
FIG. 3a is a stereoscopic schematic diagram of the metal oxide semiconductor transistor and a diode of Embodiment 1 of the present invention.
Figure 3B:
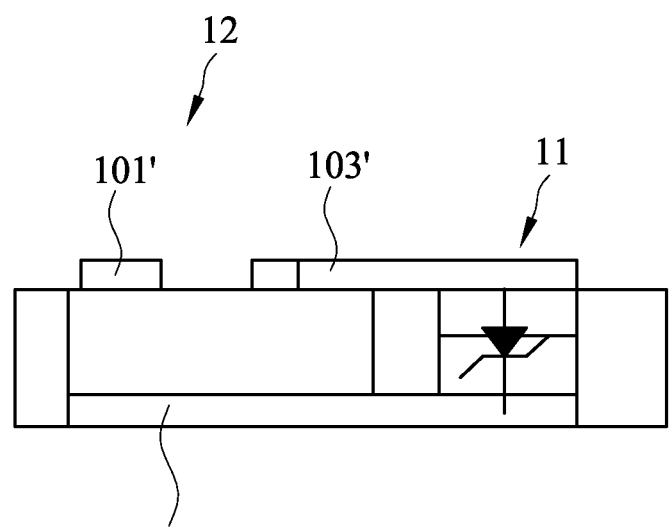
FIG. 3b is a schematic side view of the metal oxide semiconductor transistor and the diode according to Embodiment 1 of the present invention.

Please refer to FIG. 2a to FIG. 3b, FIG. 2a is a schematic top view of a gallium nitride semiconductor die of Embodiment 1 of the present invention; FIG. 2b is a schematic side view of the gallium nitride semiconductor die of Embodiment 1 of the present invention; FIG. 3a is a stereoscopic schematic diagram of the metal oxide semiconductor transistor and a diode of Embodiment 1 of the present invention; and FIG. 3b is a schematic side view of the metal oxide semiconductor transistor and the diode according to Embodiment 1 of the present invention.

As shown in FIG. 2a to FIG. 2b, the gallium nitride semiconductor die 10 with a laterally conductive vertical structure of Embodiment 1 of the present invention has a gate 101, a drain 102, a source 103 and a through hole 104, and the gallium nitride semiconductor die 10 has a front surface 105 and a back surface 106 opposite to the front surface 105. The source 103 of the gallium nitride semiconductor die 10 is connected to the back surface 106 through the through hole 104. As shown in FIG. 3a to FIG. 3b, the diode 11 and the metal oxide semiconductor transistor 12 are connected together by a metal oxide semiconductor process to form a gate 101', a drain 102' and a source 103'.

Figure 4:
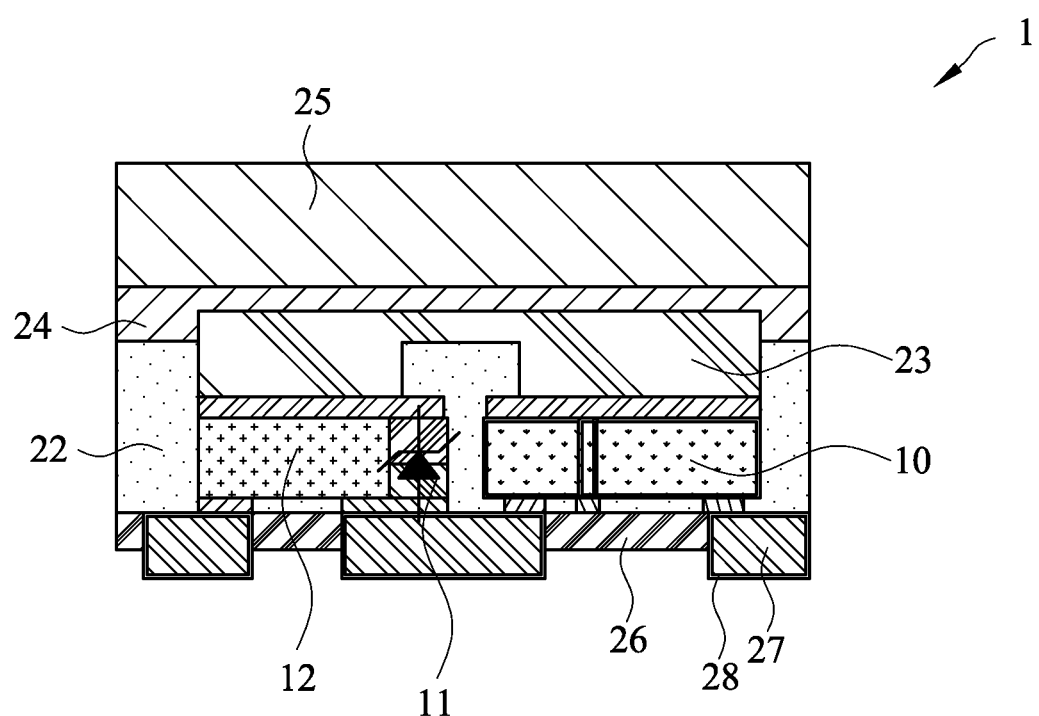
FIG. 4 is a schematic diagram of a structure of the power electronic according to Embodiment 1 of the present invention.

Please refer to FIG. 4, FIG. 4 is a schematic diagram of a structure of the power electronic according to Embodiment 1 of the present invention.

As shown in FIG. 4, the present invention also provides a package structure for a cascode power electronic device made by the aforementioned method, and the package structure 1 comprises a plurality of package modules 1' cascaded with each other in an array. Further, every package module 1' comprises a gallium nitride semiconductor die 10, a diode 11, a metal oxide semiconductor transistor 12, a first photo-developing layer 22, a copper plating layer 23, a first plastic layer 24, a heat sink 25, a second photo-developing layer 26, a redistribution layer 27 and a protective layer 28; wherein the diode 11 is connected to the metal oxide semiconductor transistor 12; and there is a set distance between the gallium nitride semiconductor die 10 and the diode 11 connecting the metal oxide semiconductor transistor 12. Further, the first photo-developing layer 22 covers the gallium nitride semiconductor die 10, the diode 11 and the metal oxide semiconductor transistor 12; and a first opening 223 is revealed through exposure and development, as shown in FIG. 1c. Furthermore, the copper plating layer 23 is disposed on the first opening 223 to connect the gallium nitride semiconductor die 10 and the diode 11 connecting the metal oxide semiconductor transistor 12. The first plastic layer 24 is disposed on the copper plating layer 23 and the first surface 221 of the first photo-developing layer 22. In addition, the heat sink 25 is provided on the first plastic layer 24; and the second photo-developing layer 26 covers a second surface 222 of the first photo-developing layer 22. Furthermore, a second opening 26 is revealed through exposure and development, as shown in FIG. 1g; the redistribution layer 27 is disposed on second opening 261; and the protective layer 28 is arranged around the redistribution layer 27.

Figure 5A:
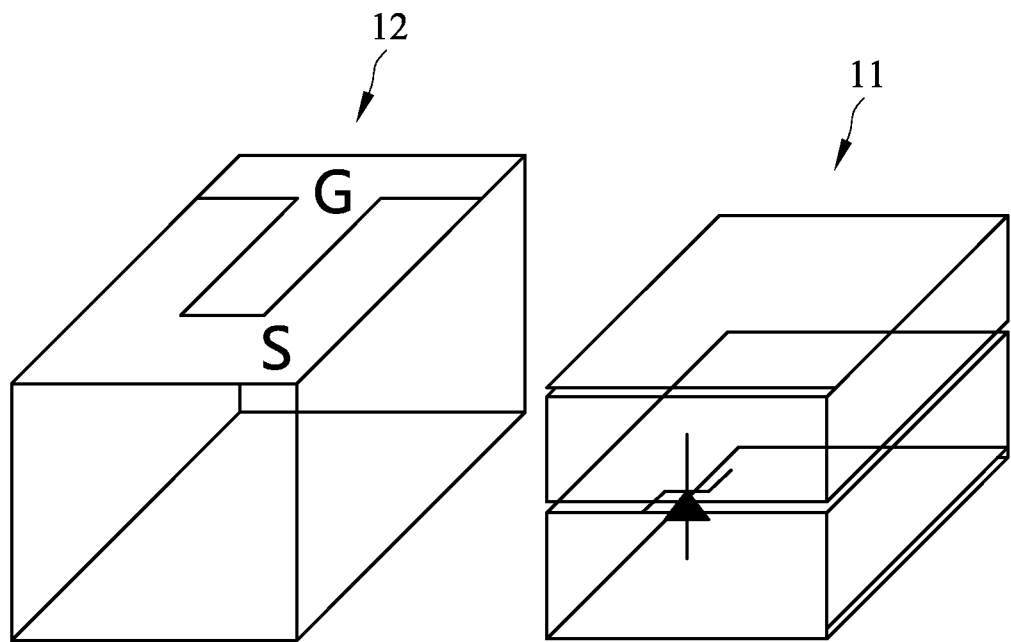
FIG. 5a is a stereoscopic schematic diagram of the metal oxide semiconductor transistor and the diode according to Embodiment 2 of the present invention.
Figure 5B:
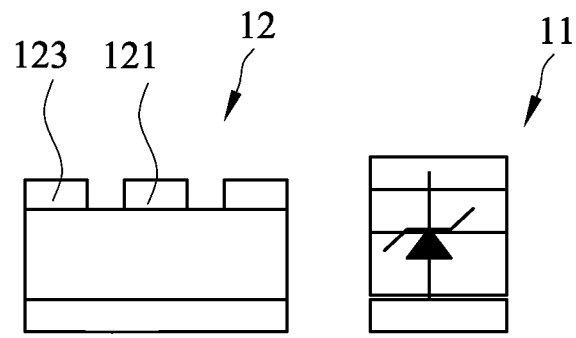
FIG. 5b is a schematic side view of the metal oxide semiconductor transistor and the diode of Embodiment 2 of the present invention.
Figure 6:
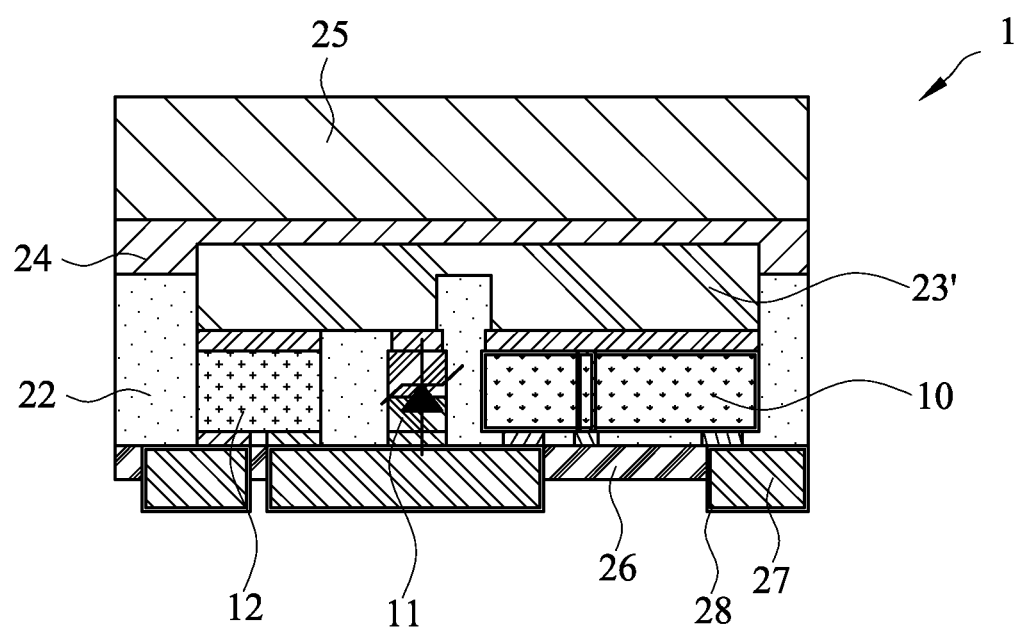
FIG. 6 is a schematic view of structure of the power electronic device according to Embodiment 2 of the present invention.

Please refer to FIG. 5a and FIG. 6, FIG. 5a is a stereoscopic schematic diagram of the metal oxide semiconductor transistor and the diode according to Embodiment 2 of the present invention; FIG. 5b is a schematic side view of the metal oxide semiconductor transistor and the diode of Embodiment 2 of the present invention; and FIG. 6 is a schematic view of structure of the power electronic device according to Embodiment 2 of the present invention.

As shown in FIG. 5a and FIG. 5b, the structure shown in Embodiment 2 is substantially the same as Embodiment 1, but the differences are as follows. In the first embodiment, the diode 11 and the metal oxide semiconductor transistor 12 are connected together by a metal oxide semiconductor process. However, in Embodiment 2, the diode 11 and the metal oxide semiconductor transistor 12 are separated from each other. As shown in FIG. 6, the diode 11 and the metal oxide semiconductor transistor 12 are separated from each other, and the gallium nitride semiconductor die 10, the diode 11 and the metal oxide semiconductor transistor 12 are connected to each other by the metal layer 23'.

Please refer to FIG. 7a to FIG. 7j, FIG. 7a to FIG. 7j are structural diagrams of packaging steps of the power electronic device according to Embodiment 3 of the present invention.

Figure 7A:
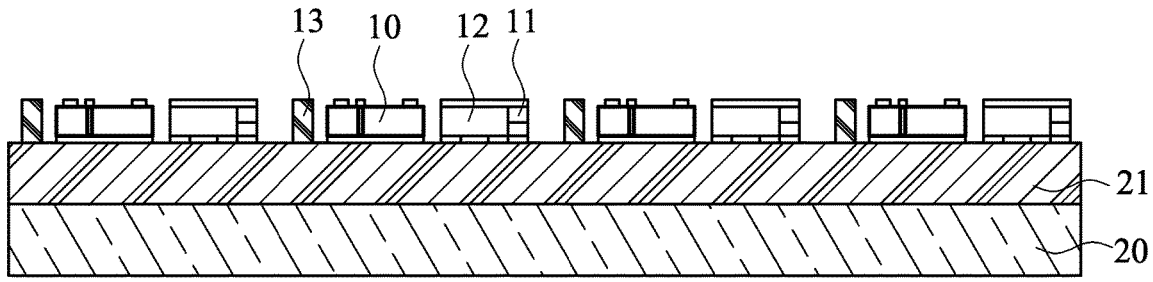
FIG. 7a to FIG. 7j are structural diagrams of packaging steps of the power electronic device according to Embodiment 3 of the present invention.
Figure 7B:
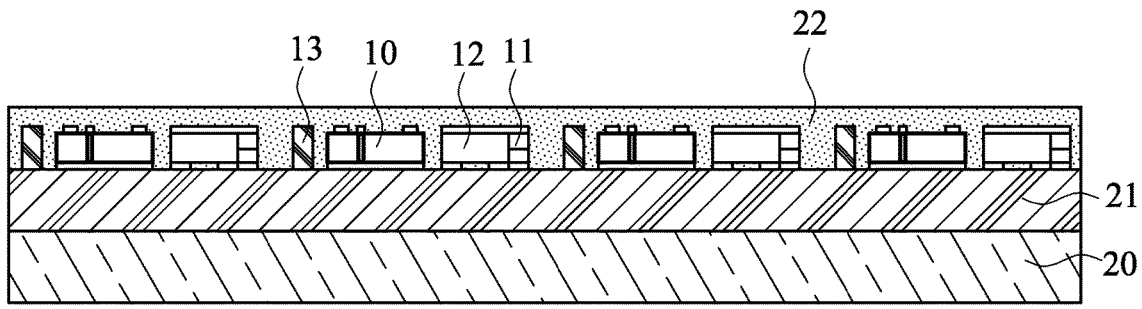
Figure 7C:
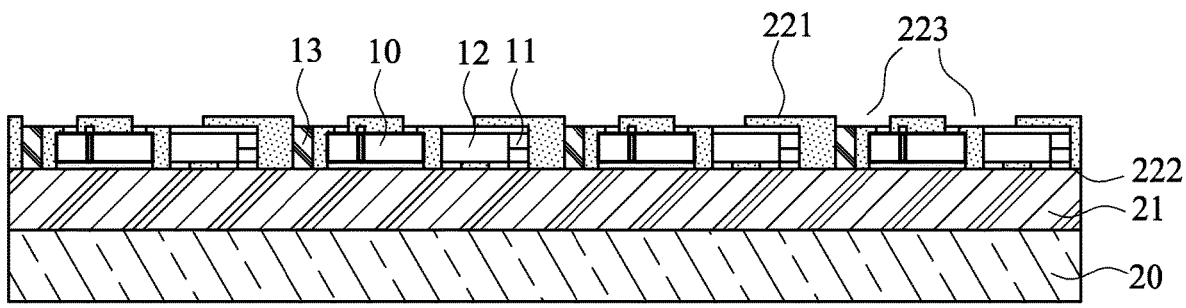
Figure 7D:
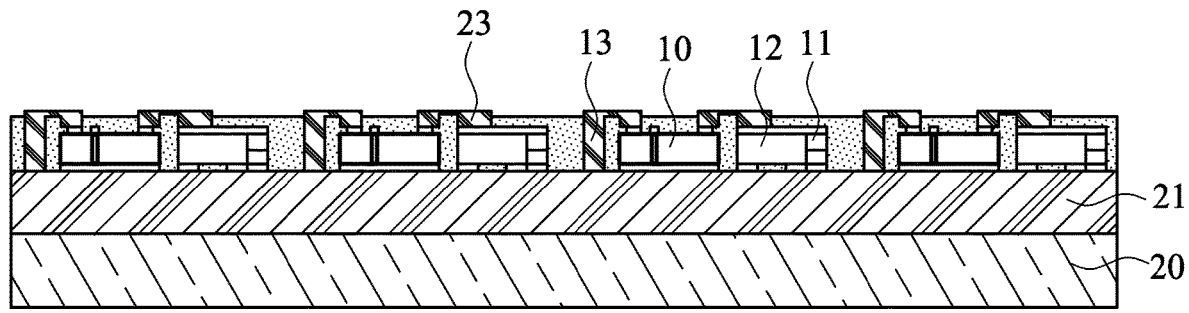
Figure 7E:
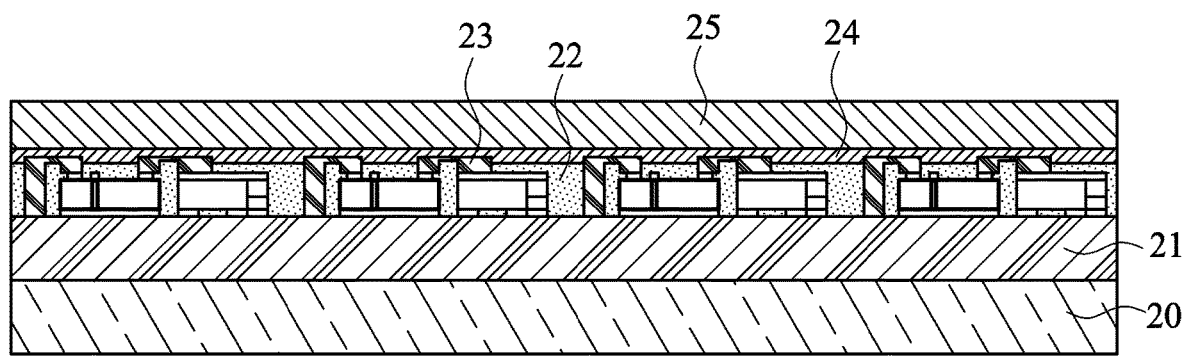
Figure 7F:
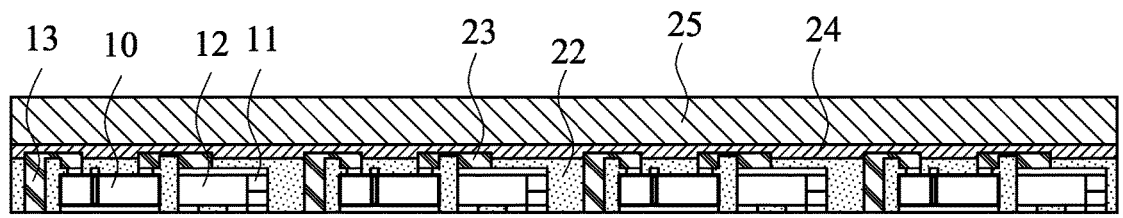
Figure 7G:
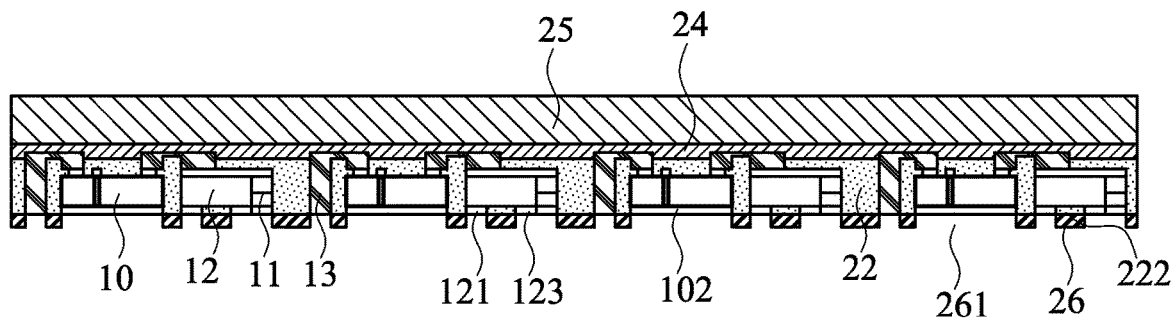
Figure 7H:
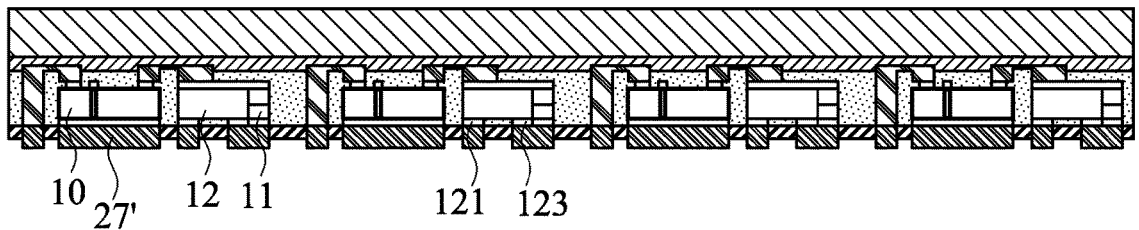
Figure 7I:
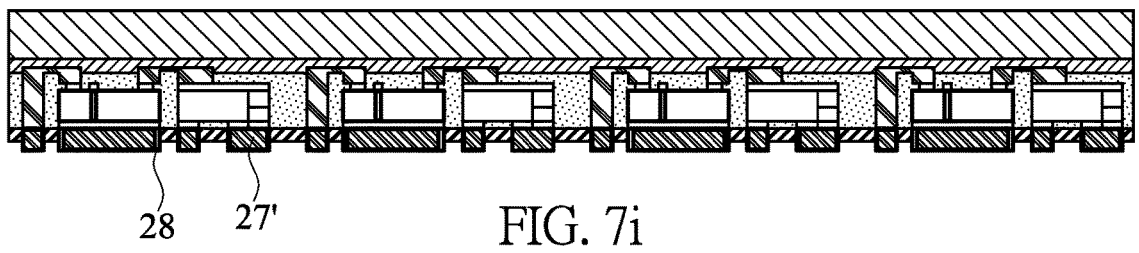
Figure 7J:
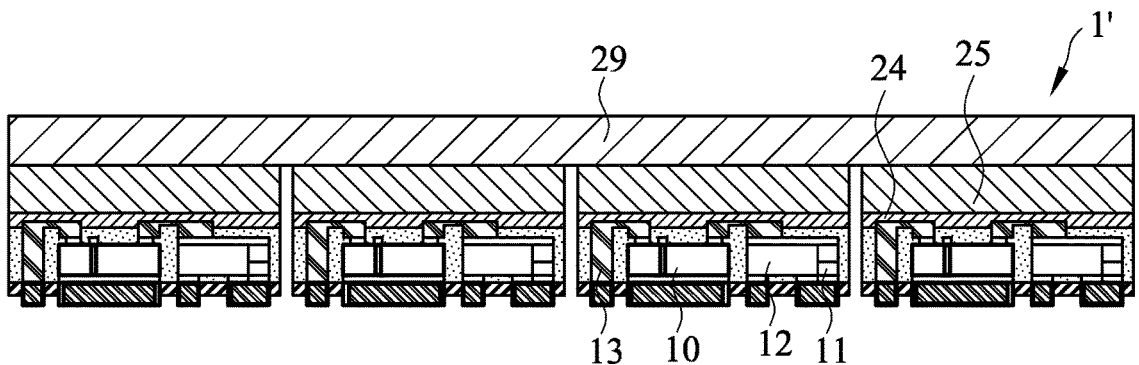
Figure 9:
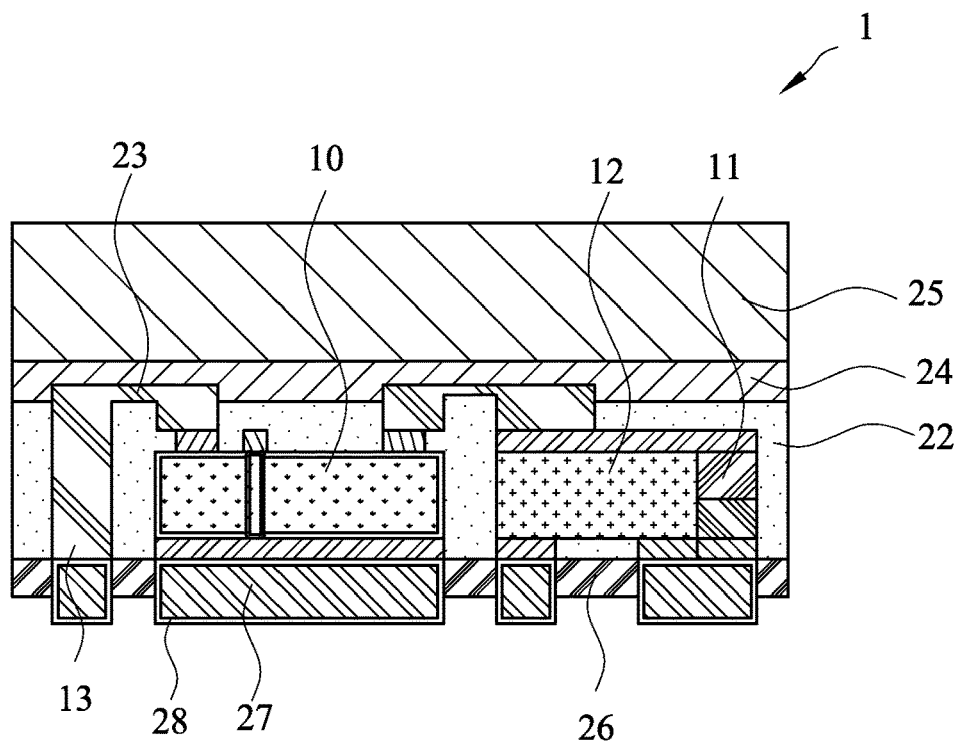
FIG. 9 is a schematic view of structure of the power electronic device according to Embodiment 3 of the present invention.

As shown in FIG. 7a to FIG. 7j, the present invention further provides a packaging method for a cascode power electronic device comprising:

providing a substrate 20 and disposing a pressure sensitive adhesive layer 21 on the substrate 20;

disposing more than one gallium nitride semiconductor die 10, more than one diode 11, more than one metal oxide semiconductor transistor 12 and more than one metal block 13 on the pressure sensitive adhesive layer 21, as shown in FIG. 7a;

coating a first photo-developing layer 22 on the pressure sensitive adhesive layer 22, the first photo-developing layer 22 covering the gallium nitride semiconductor die 10, the diode 11, the metal oxide semiconductor transistor 12 and the metal block 13, as shown in FIG. 7b;

exposing and developing a first surface 221 of the first photo-developing layer 22 on the gallium nitride semiconductor die 10, the diode 11, the metal oxide semiconductor transistor 12 and the metal block 13, as shown in FIG. 7c, and plating copper on the exposed and developed area to form a copper plating layer 23, as shown in FIG. 7d;

disposing a first plastic layer 24 on the first photo-developing layer 22, the first plastic layer 24 covering the unexposed development area and the copper plating layer 23, and providing a heat sink 25 on the first plastic layer 24, as shown in FIG. 7e;

peeling the substrate 20 and the pressure sensitive adhesive layer 21, as shown in FIG. 7f;

coating a second photo-developing layer 26 on a second surface 222 of the first photo-developing layer 22, and the second photo-developing layer 26 covering the gallium nitride semiconductor die 10, the diode 11, metal oxide semiconductor transistor 12 and the metal block 13;

exposing and developing the second photo-developing layer 26 to reveal a drain 102 of the gallium nitride semiconductor die 10, a gate 121 and a source 123 of the metal oxide semiconductor transistor 12, the diode 11 and the metal block 13, as shown in FIG. 7g;

plating metal on the drain 102 of the gallium nitride semiconductor die 10, the gate 121 and the source 123 of the metal oxide semiconductor transistor 12, the diode 11 and the metal block 13 to form a metal layer 27', as shown in FIG. 7h;

plating a protective layer 28 on the metal layer 27', as shown in FIG. 7i; and as shown in FIG. 7j, adhering a blue tape 29 on a ceramic heat sink 25, and dicing the gallium nitride semiconductor die 10, the diode 11, the metal oxide semiconductor transistor 12, the metal block 13, the first plastic layer 24 and the ceramic heat sink 25 to form a plurality of package modules 1'; connecting the package modules 1' to each other only through the blue tape 29; stretching the blue tape 29 to increase gaps among the package modules 1'; removing the blue tape 29 to obtain the plurality of package modules 1'; and cascading with the plurality of package modules 1' to form a power electronic device, as shown in FIG. 9.

Figure 8A:
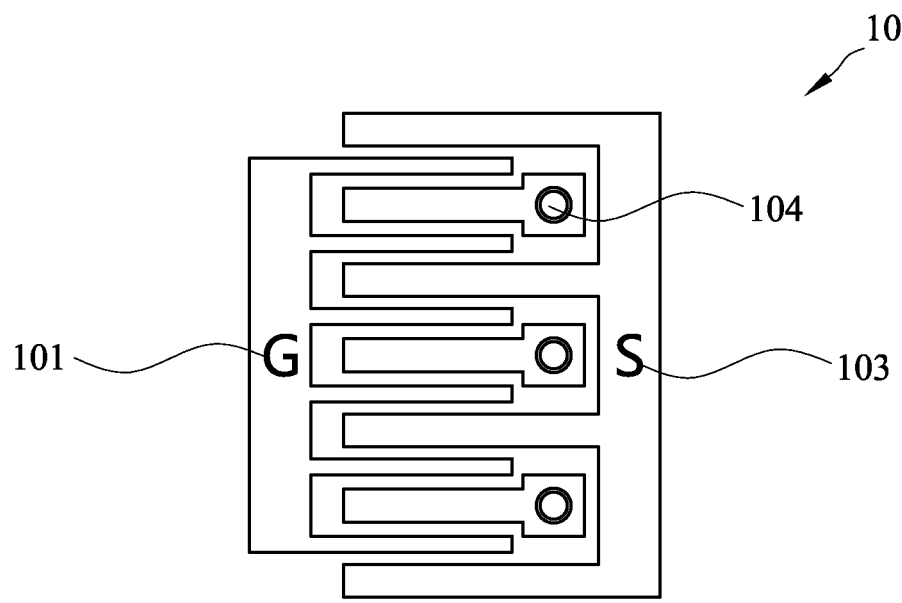
FIG. 8a is a schematic top view of the gallium nitride semiconductor die of Embodiment 3 of the present invention.
Figure 8B:
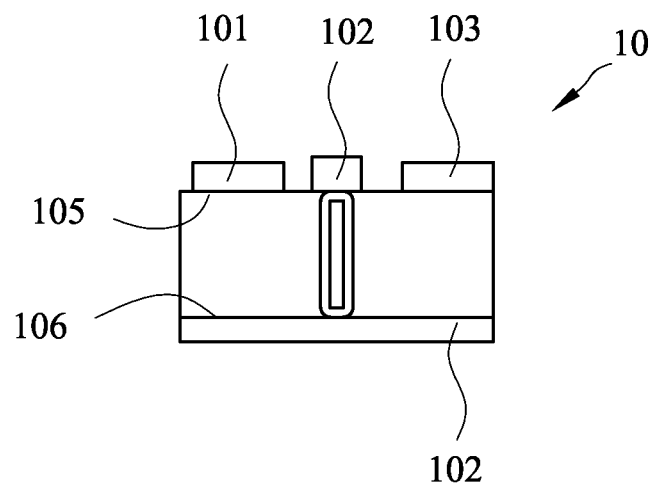
FIG. 8b is a schematic side view of the gallium nitride semiconductor die of Embodiment 3 of the present invention.

Please refer to FIG. 8a to FIG. 9, FIG. 8a is a schematic top view of the gallium nitride semiconductor die of Embodiment 3 of the present invention; FIG. 8b is a schematic side view of the gallium nitride semiconductor die of Embodiment 3 of the present invention; and FIG. 9 is a schematic view of structure of the power electronic device according to Embodiment 3 of the present invention.

As shown in FIG. 8a to FIG. 8b, in Embodiment 3 of the present invention, except for the structure of the gallium nitride semiconductor die 10, the other structures are the same as Embodiment 1. The gallium nitride semiconductor die 10 has a front surface 105 and a back surface 106 opposite to the front surface 105, and drain 102 of the gallium nitride semiconductor die 10 is connected to the back surface 106 by the through hole 104.

As shown in FIG. 9, in Embodiment 3 of the present invention, the package structure for a cascode power electronic device is made by the aforementioned method, and the package structure 1 comprises a plurality of package modules 1' cascaded with each other in an array. Further, every package module 1' comprises a gallium nitride semiconductor die 10, a diode 11, a metal oxide semiconductor transistor 12, a metal block 13, a first photo-developing layer 22, a copper plating layer 23, a first plastic layer 24, a heat sink 25, a second photo-developing layer 26, a redistribution layer 27 and a protective layer 28; wherein the diode 11 is connected to the metal oxide semiconductor transistor 12; and there is a set distance between the gallium nitride semiconductor die 10 and the diode 11 connecting the metal oxide semiconductor transistor 12; and there is another set distance between the gallium nitride semiconductor die 10 and the metal block 13. Further, the first photo-developing layer 22 covers the gallium nitride semiconductor die 10, the diode 11, the metal oxide semiconductor transistor 12 and the metal block 13; a first opening 223 is revealed through exposure and development, as shown in FIG. 7c; and the copper plating layer 23 is disposed on the first opening 223 to connect the gallium nitride semiconductor die 10 with the metal block 13 and connect the gallium nitride semiconductor die 10 with the metal oxide semiconductor transistor 12 connecting the diode 11. The first plastic layer 24 is disposed on the copper plating layer 23 and the first surface 221 of the first photo-developing layer 22. In addition, the heat sink 25 is provided on the first plastic layer 24; and the second photo-developing layer 26 covers a second surface 222 of the first photo-developing layer 22. Furthermore, the second photo-developing layer 26 is exposed and developed to reveal a second opening 261, as shown in FIG. 7g, the redistribution layer 27 is disposed on second opening 261, and the protective layer 28 is arranged around the redistribution layer 27.

Figure 10:
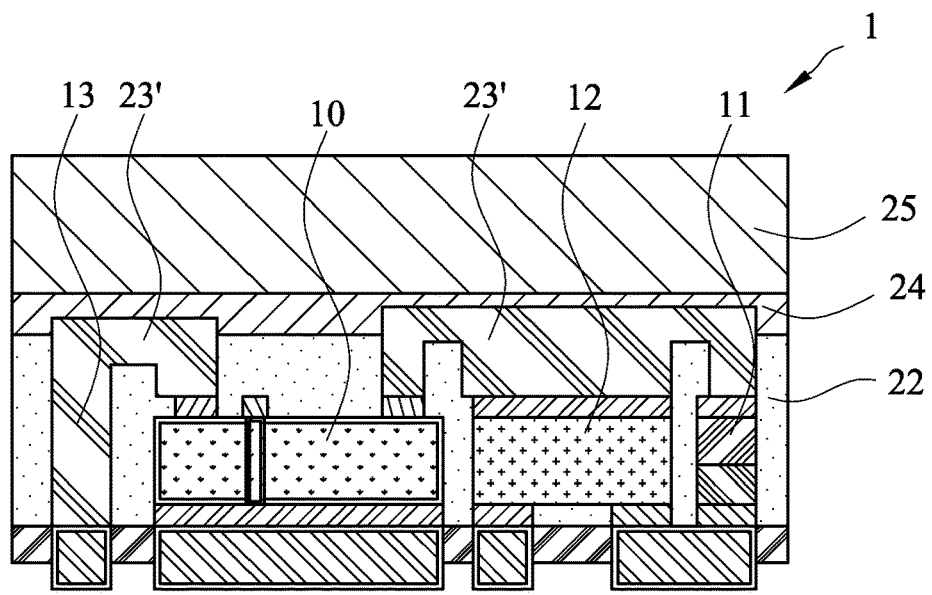
FIG. 10 is a schematic view of structure of the power electronic device according to Embodiment 4 of the present invention.

Please refer to FIG. 10, FIG. 10 is a schematic view of structure of the power electronic device according to Embodiment 4 of the present invention.

As shown in FIG. 10, the structure shown in Embodiment 4 is substantially the same as Embodiment 3, but the differences are as follows. In Embodiment 3, the metal oxide semiconductor transistor 12 and the diode 11 are connected together by a metal oxide semiconductor process. As shown in FIG. 10, the diode 11 and the metal oxide semiconductor transistor 12 are separated from each other, and the gallium nitride semiconductor die 10, the diode 11, the metal oxide semiconductor transistor 12 and the metal block 13 are connected to each other by the metal layer 23'.

Please refer to FIG. 11a to FIG. 11c, FIG. 11a is a schematic side view of the metal oxide semiconductor transistor and the diode according to Embodiment 5 of the present invention; FIG. 11b is a schematic top view of the metal oxide semiconductor transistor and the diode according to Embodiment 5 of the present invention; and FIG. 11c is a schematic top view of the gallium nitride semiconductor die, the metal oxide semiconductor transistor and the diode according to Embodiment 5 of the present invention.

As shown in FIG. 11a to FIG. 11c, Embodiment 5 is the same as Embodiment 1 except that Embodiment 5 includes two gallium nitride semiconductor dies 10, two diodes 11 and two metal oxide semiconductor transistors 12. In Embodiment 5, the diode 11 and the metal oxide semiconductor transistor 12 have a first gate G1, a second gate G2, a first drain D1, a second drain D2, a first source S1 and a second source S2. It can be seen from FIG. 11c that the two gallium nitride semiconductor dies 10, the two diodes 11 and the two metal oxide semiconductor transistors 12; therefore, the two gallium nitride semiconductor die 10 cannot be seen in FIG. 11a.

Figure 12:
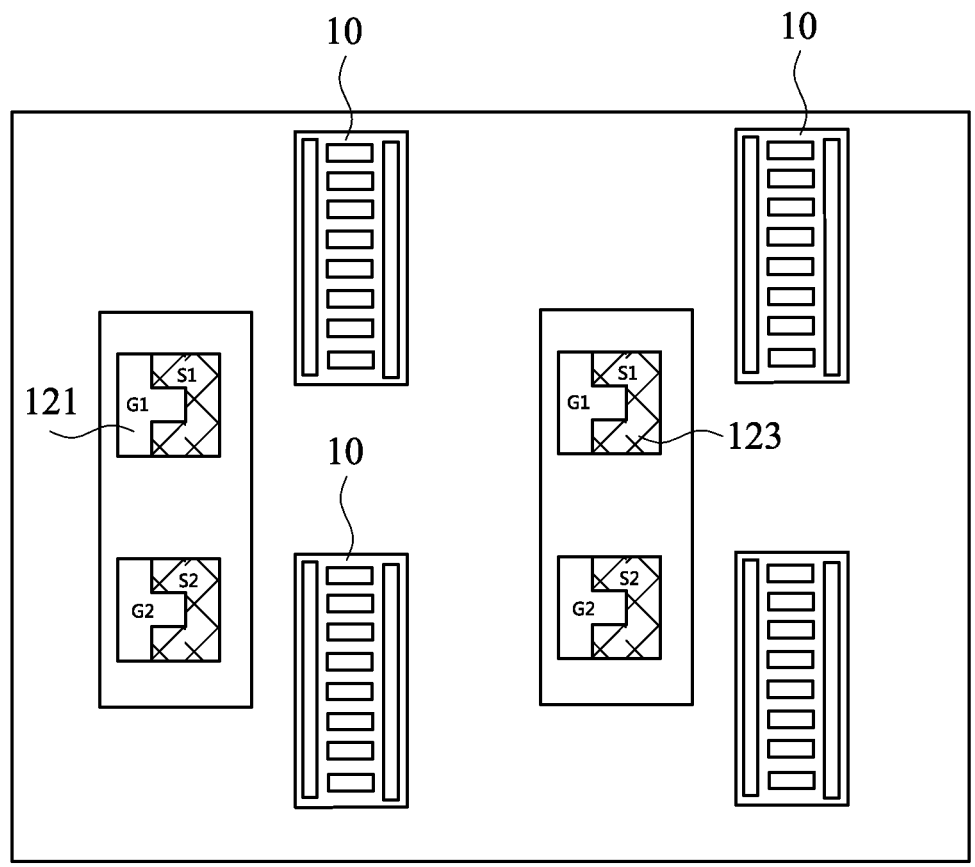
FIG. 12 is a schematic top view of the gallium nitride semiconductor die, the metal oxide semiconductor transistor and the diode according to Embodiment 6 of the present invention.

Please refer to FIG. 12, FIG. 12 is a schematic top view of the gallium nitride semiconductor die, the metal oxide semiconductor transistor and the diode according to Embodiment 6 of the present invention.

As shown in FIG. 12, Embodiment 6 is the same as Embodiment 1 except that Embodiment 6 includes four gallium nitride semiconductor dies 10, four diodes 11 and four metal oxide semiconductor transistors 12.

Please refer to FIG. 13a to FIG. 13l, FIG. 13a to FIG. 13l are structural views of the packaging steps of the power electronic device according to Embodiment 7 of the present invention.

Figure 13A:
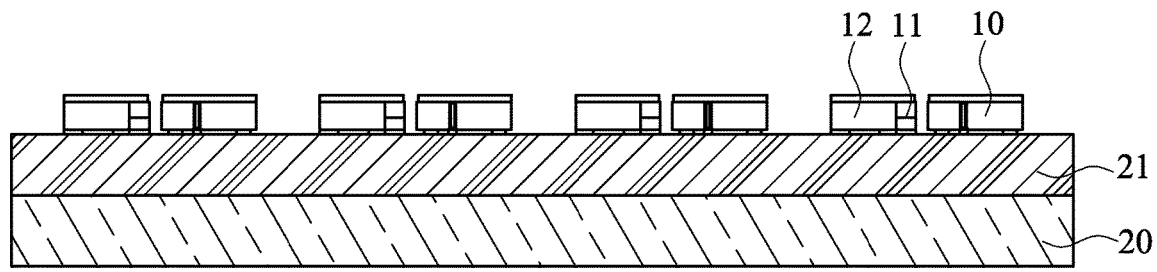
FIG. 13a to FIG. 13l are structural diagrams of packaging steps of the power electronic device according to Embodiment 7 of the present invention.
Figure 13B:
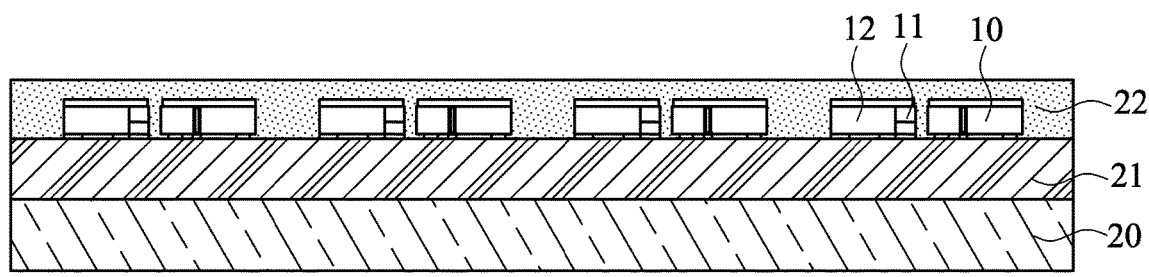
Figure 13C:
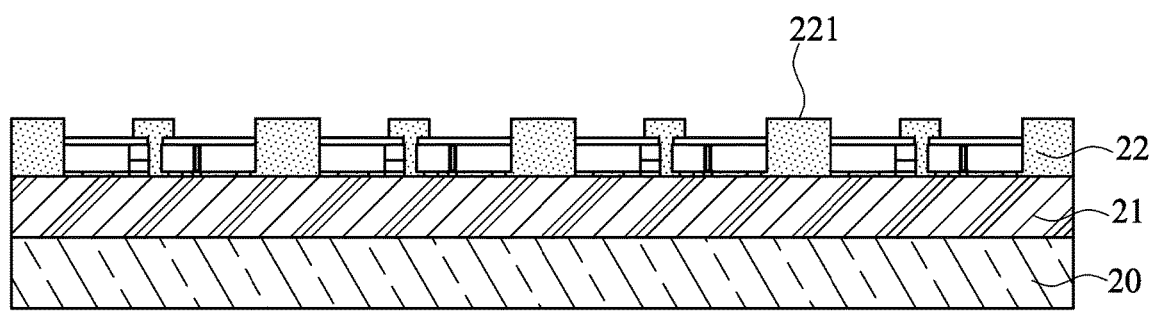
Figure 13D:
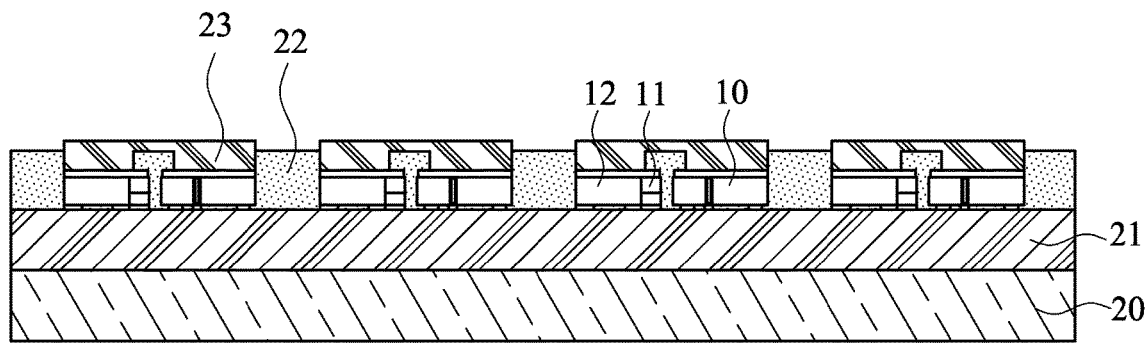
Figure 13E:
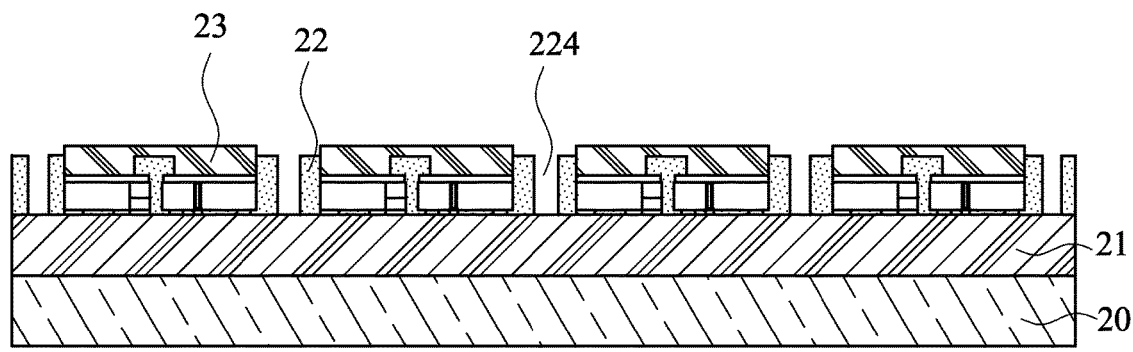
Figure 13F:
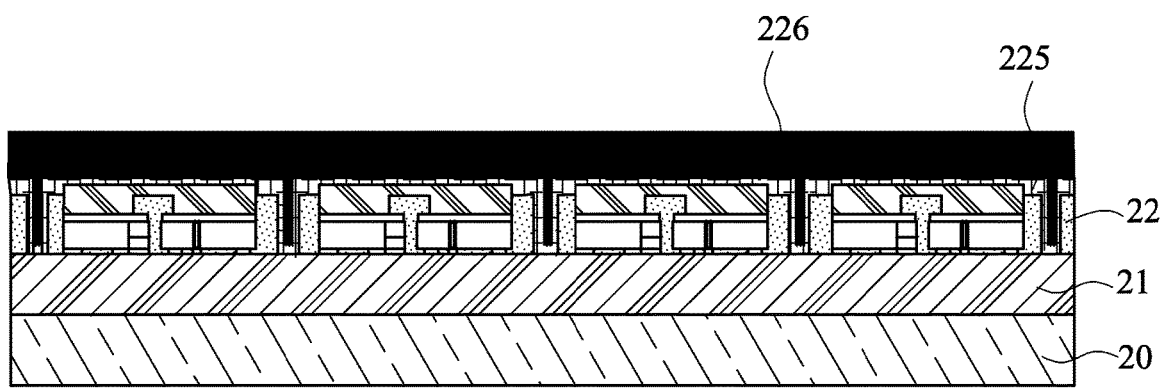
Figure 13G:
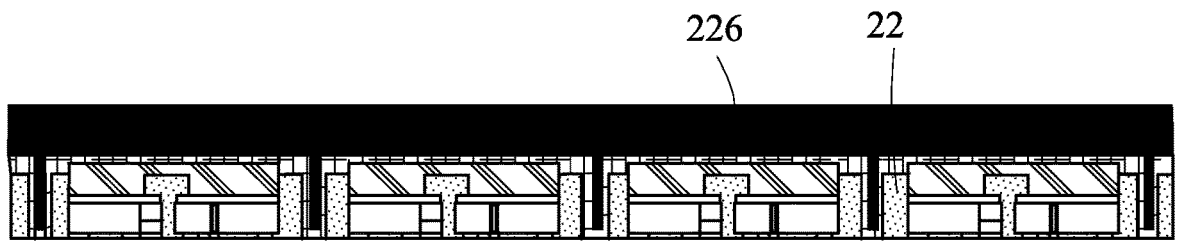
Figure 13H:
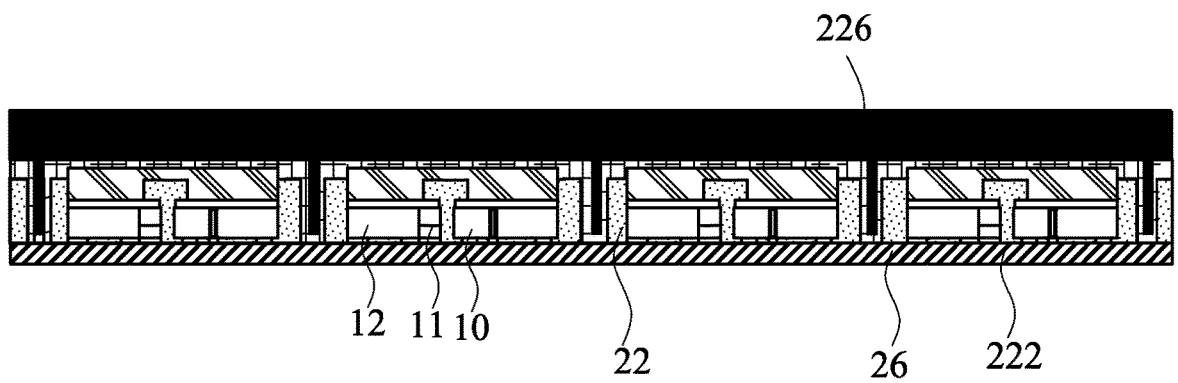
Figure 13I:
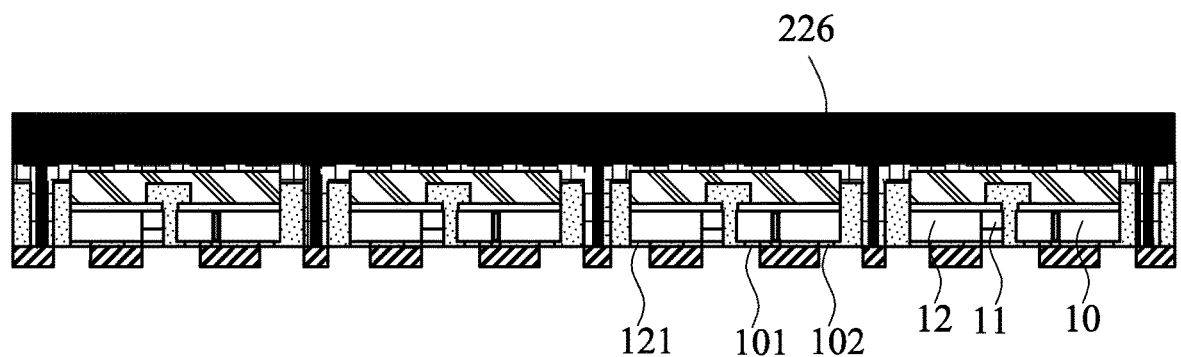
Figure 13J:
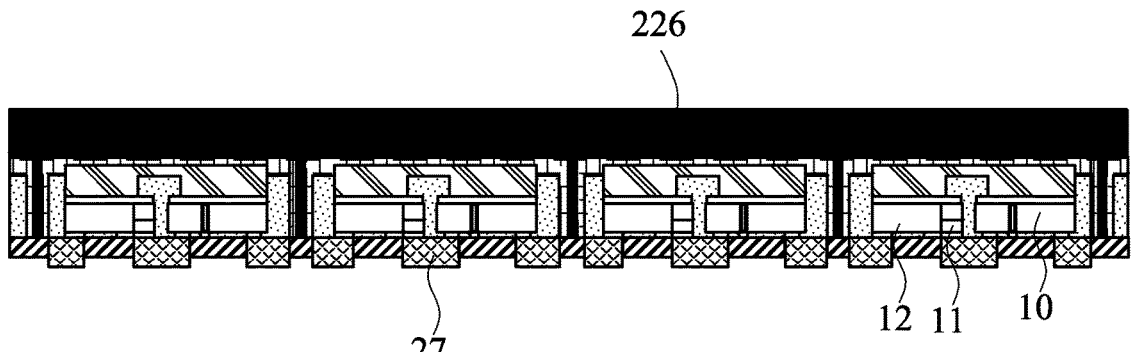
Figure 13K:
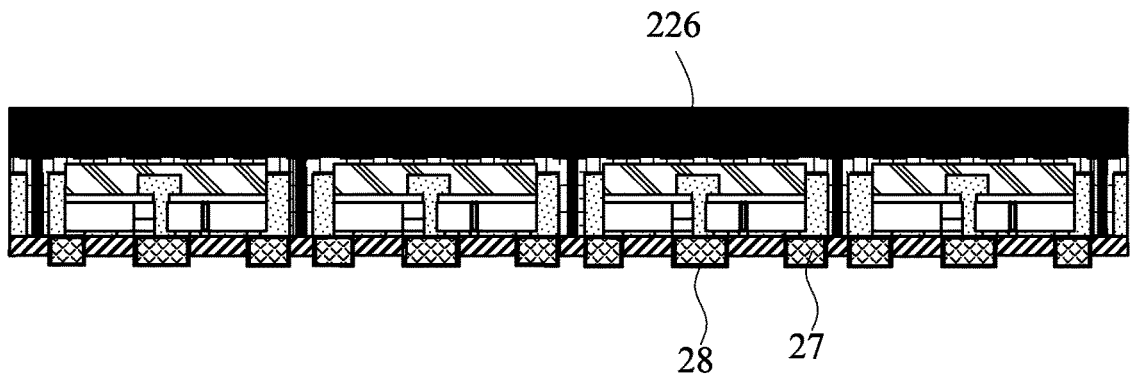
Figure 13L:
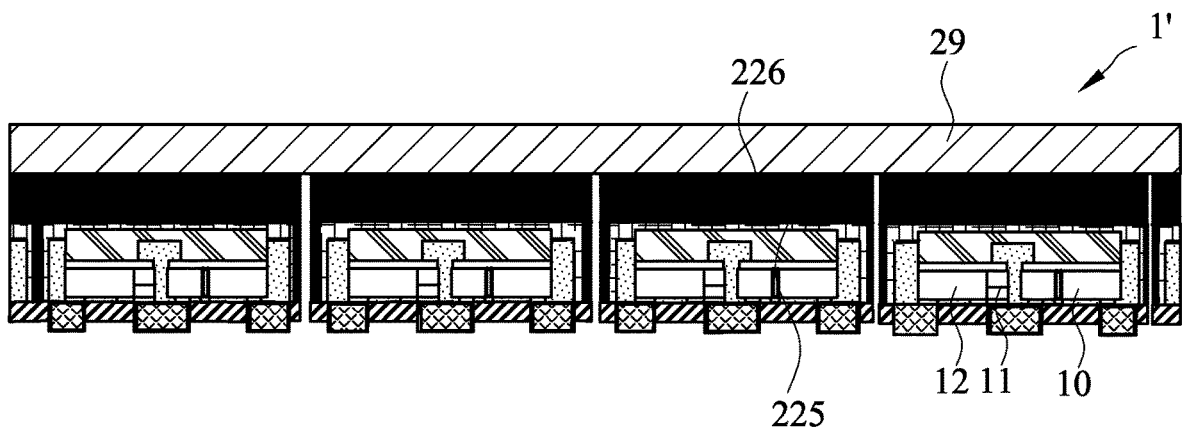

As shown in FIG. 13a to FIG. 13l, the present invention further provides a packaging method for a cascode power electronic device comprising: providing a substrate 20 and disposing a pressure sensitive adhesive layer 21 on the substrate 20;

disposing more than one gallium nitride semiconductor die 10, more than one diode 11 and more than one metal oxide semiconductor transistor 12 on the pressure sensitive adhesive layer 21, as shown in FIG. 13a;

coating a first photo-developing layer 22 on the pressure sensitive adhesive layer 21, and the first photo-developing layer 22 covering the gallium nitride semiconductor die 10, the diode 11 and the metal oxide semiconductor transistor 12, as shown in FIG. 13b;

exposing and developing a first surface 221 of the first photo-developing layer 22 on the gallium nitride semiconductor die 10, the diode 11 and the metal oxide semiconductor transistor 12, as shown in FIG. 13c, and plating copper on the exposed and developed area to form a copper plating layer 23, as shown in FIG. 13d;

separating the first photo-developing layer 22 into a plurality of interval grooves 224, as shown in FIG. 13e;

disposing a second plastic layer 24 on the interval grooves 224, and disposing a dam 226 on the second plastic layer 24, as shown in FIG. 13f;

peeling the substrate 20 and the pressure sensitive adhesive layer 21, as shown in FIG. 13g;

coating a second photo-developing layer 26 on a second surface 222 of the first photo-developing layer 22, and the second photo-developing layer 26 covering the gallium nitride semiconductor die 10, the diode 11 and metal oxide semiconductor transistor 12, as shown in FIG. 13h;

exposing and developing the second photo-developing layer 26 to reveal the gate 101 and the drain 102 of the gallium nitride semiconductor die 10, the gate 121 of the metal oxide semiconductor transistor 12 and the diode 11, as shown in FIG. 13i;

forming a redistribution layer 27 on the gate 101 and the drain 102 of the gallium nitride semiconductor die 10, the drain 121 of the metal oxide semiconductor transistor 12 and the diode 11, as shown in FIG. 13j;

plating a protective layer 28 on redistribution layer 27, as shown in FIG. 13k; and adhering a blue tape 29 on the dam 226, and dicing the gallium nitride semiconductor die 10, the diode 11, the metal oxide semiconductor transistor 12 and the second plastic layer 225 to form a plurality of package modules 1'; connecting the package modules 1' to each other only through the blue tape 29; stretching the blue tape 29 to increase gaps among the package modules 1'; removing the blue tape 29 to obtain the plurality of package modules 1'; and cascading with the plurality of package modules 1' to form a power electronic device 1, as shown in FIG. 13l.

Figure 14:
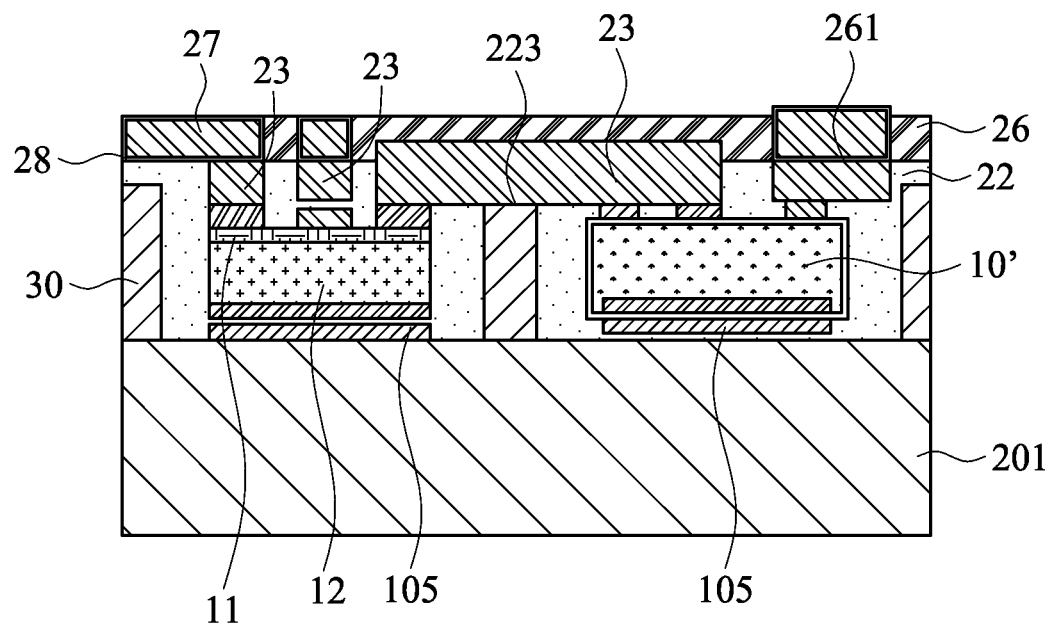
FIG. 14 is a schematic diagram of the structure of the power electronic device according to Embodiment 8 of the present invention.

Please refer to FIG. 14, FIG. 14 is a schematic diagram of the structure of the power electronic device according to Embodiment 8 of the present invention.

As shown in FIG. 14, the packaging structure of the power electronic device 1 of Embodiment 8 includes a plurality of packaging modules 1', and each packaging module 1' includes the gallium nitride semiconductor die 10' with a horizontal structure, the diode 11, and the metal oxide semiconductor transistor 12, the first photo-developing layer 22, the copper plating layer 23, the second photo-developing layer 26, the redistribution layer 27, the protective layer 28, and a separator 30. Further, the diode 11 and the metal oxide semiconductor transistor 12 are connected together; the gallium nitride semiconductor die 10' and the metal oxide semiconductor transistor 12 are disposed on a lead-frame 201 by a solder paste 15; and the separators 30 are installed on two sides of the gallium nitride semiconductor die 10' and the metal oxide semiconductor transistor 12. Furthermore, the first photo-developing layer 22 covers the gallium nitride semiconductor die 10', the diode 11, the metal oxide semiconductor transistor 12 and the separators 30; and the first opening 223 is revealed by the exposure and development. Moreover, the copper plating layer 23 is disposed on the first opening 223 to connect the gallium nitride semiconductor die 10', the metal oxide semiconductor transistor 12 and the separators 30. The second photo-developing layer 26 covers the first photo-developing layer 22 and the copper plating layer 23, and the second opening 261 is revealed by the exposure and development. Additionally, the redistribution layer 27 is disposed on the second opening 261, and the protective layer 28 is arranged around the redistribution layer 27.

The foregoing description, for the purpose of explanation, has been described with reference to specific embodiments. However, the embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

We claim:

1. A packaging method for a cascode power electronic device, comprising:
   providing a substrate and disposing a pressure sensitive adhesive layer on the substrate;
   disposing more than one gallium nitride semiconductor die, more than one diode and more than one metal oxide semiconductor transistor on the pressure sensitive adhesive layer;
   coating a first photo-developing layer on the pressure sensitive adhesive layer, the first photo-developing layer covering the gallium nitride semiconductor die, the diode and the metal oxide semiconductor transistor;
   exposing and developing a first surface of the first photo-developing layer on the gallium nitride semiconductor die, the diode, and metal oxide semiconductor transistor, and plating copper on the exposed and developed area to form a copper plating layer;
   disposing a first plastic layer on the first photo-developing layer, the first plastic layer covering the unexposed development area on the first photo-developing layer and the copper plating layer, and providing a heat sink on the first plastic layer;
   peeling the substrate and the pressure sensitive adhesive layer;
   coating a second photo-developing layer on a second surface of the first photo-developing layer, and the second photo-developing layer covering the gallium nitride semiconductor die, the diode, and metal oxide semiconductor transistor;
   exposing and developing the second photo-developing layer to reveal a gate and a drain of the gallium nitride semiconductor die, a drain and a source of the metal oxide semiconductor transistor and the diode;
   forming a redistribution layer on the gate and the drain of the gallium nitride semiconductor die, the drain and the source of the metal oxide semiconductor transistor and the diode;
   plating a protective layer on the redistribution layer; and
   adhering a blue tape on a ceramic heat sink, and dicing the gallium nitride semiconductor die, the diode, the metal oxide semiconductor transistor, the first plastic layer and the ceramic heat sink to form a plurality of package modules; connecting the package modules to each other only through the blue tape; stretching the blue tape to increase gaps between the package modules; removing the blue tape to obtain the plurality of package modules; and cascading with the plurality of package modules to form a power electronic device.

2. The packaging method for a cascode power electronic device mentioned in claim 1, wherein the gallium nitride semiconductor die is a laterally conductive vertical structure or a horizontal structure; the gallium nitride semiconductor die has a front surface and a back surface opposite to the front surface; and the source of gallium nitride semiconductor die is connected to the back surface by a through hole.

3. The packaging method for a cascode power electronic device mentioned in claim 1, wherein the metal oxide semiconductor transistor and the diode are connected together by a metal oxide semiconductor process.

4. The packaging method for a cascode power electronic device mentioned in claim 1, wherein after the copper plating layer is formed and before the substrate and the pressure sensitive adhesive layer are peeled off, the first photo-developing layer is separated into a plurality of interval grooves, a second plastic layer is disposed on the interval grooves, and a baffle is installed on the second plastic layer.

5. A package structure for a cascode power electronic device, comprising: a plurality of package modules cascaded with each other, and every package module comprising a gallium nitride semiconductor die, a diode, a metal oxide semiconductor transistor, a first photo-developing layer, a copper plating layer, a first plastic layer, a heat sink, a second photo-developing layer, a redistribution layer and a protective layer;
   wherein the gallium nitride semiconductor die is a laterally conductive vertical structure or a horizontal structure; the diode is connected to the metal oxide semiconductor transistor; and there is a set distance between the gallium nitride semiconductor die with the diode connecting the metal oxide semiconductor transistor;
   wherein the first photo-developing layer covers the gallium nitride semiconductor die, the diode and the metal oxide semiconductor transistor; a first opening is revealed through exposure and development; and the copper plating layer is disposed on the first opening to connect the gallium nitride semiconductor die with the diode and the metal oxide semiconductor transistor;

wherein the first plastic layer is disposed on the copper plating layer and the first surface of the first photo-developing layer; the heat sink is installed on the first plastic layer; and the second photo-developing layer covers a second surface of the first photo-developing layer;

wherein a second opening is revealed through exposure and development, the redistribution layer is disposed on second opening, and the protective layer is arranged around the redistribution layer.

6. The package structure for a cascode power electronic device mentioned in claim 5, wherein the heat sink is a ceramic heat sink or a metal plate; and the protective layer is a nickel metal layer, a copper metal layer or a nickel-copper alloy layer.

7. A packaging method for a cascode power electronic device, comprising:

providing a substrate and disposing a pressure sensitive adhesive layer on the substrate;

disposing more than one gallium nitride semiconductor die, more than one diode, more than one metal oxide semiconductor transistor and more than one metal block on the pressure sensitive adhesive layer;

coating a first photo-developing layer on the pressure sensitive adhesive layer, the first photo-developing layer covering the gallium nitride semiconductor die, the diode, the metal oxide semiconductor transistor and the metal block;

exposing and developing a first surface of the first photo-developing layer on the gallium nitride semiconductor die, the metal oxide semiconductor transistor, the diode and the metal block, and plating copper on the exposed and developed area to form a copper plating layer;

disposing a first plastic layer on the first photo-developing layer, the first plastic layer covering on the unexposed development area and the copper plating layer, and providing a heat sink on the first plastic layer;

peeling the substrate and the pressure sensitive adhesive layer;

coating a second photo-developing layer on a second surface of the first photo-developing layer, and the second photo-developing layer covering the gallium nitride semiconductor die, the diode, the metal oxide semiconductor transistor and the metal block;

exposing and developing the second photo-developing layer to reveal a drain of the gallium nitride semiconductor die, a gate and a source of the metal oxide semiconductor transistor, the diode and the metal block;

plating metal on the exposed area to form a metal layer;

plating a protective layer on the metal layer; and adhering a blue tape on a ceramic heat sink, and dicing the gallium nitride semiconductor die, the diode, the metal oxide semiconductor transistor, the metal block, the first plastic layer and the ceramic heat sink to form a plurality of package modules; connecting the package modules to each other only through the blue tape; stretching the blue tape to increase gaps among the package modules; removing the blue tape to obtain the plurality of package modules; and cascading with the plurality of package modules to form a power electronic device.

8. The packaging method for a cascode power electronic device mentioned in claim 7, wherein the gallium nitride semiconductor die is a laterally conductive vertical structure or a horizontal structure; the gallium nitride semiconductor die has a front surface and a back surface opposite to the front surface; and the drain of gallium nitride semiconductor die is connected to the back surface by a through hole.

9. The packaging method for a cascode power electronic device mentioned in claim 7, wherein the metal oxide semiconductor transistor and the diode are connected together by a metal oxide semiconductor process.

10. A package structure for a cascode power electronic device, comprising a plurality of package modules cascaded with each other, and every package module comprising a gallium nitride semiconductor die, a diode, a metal oxide semiconductor transistor, a metal block, a first photo-developing layer, a copper plating layer, a first plastic layer, a heat sink, a second photo-developing layer, a redistribution layer and a protective layer;

wherein the gallium nitride semiconductor die is a laterally conductive vertical structure or a horizontal structure; the diode is connected to the metal oxide semiconductor transistor; and there is a set distance between the gallium nitride semiconductor die with the diode connecting the metal oxide semiconductor transistor; and there is another set distance between the gallium nitride semiconductor die with the metal block;

wherein the first photo-developing layer covers the gallium nitride semiconductor die, the diode, the metal oxide semiconductor transistor and the metal block; a first opening is revealed through exposure and development; and the copper plating layer is disposed on the first opening to connect the gallium nitride semiconductor die with the metal block and connect the gallium nitride semiconductor die with the diode connecting the metal oxide semiconductor transistor;

wherein the first plastic layer is disposed on the copper plating layer and the first surface of the first photo-developing layer; the heat sink is installed on the first plastic layer; and the second photo-developing layer covers a second surface of the first photo-developing layer;

wherein the second photo-developing layer is exposed and developed to reveal a second opening, the redistribution layer is disposed on second opening, and the protective layer is arranged around the redistribution layer.

* * * * *